(12) United States Patent  (10) Patent No.: US 12,112,695 B2
Thielemans et al.  (45) Date of Patent: Oct. 8, 2024

(54) DISPLAY SYSTEMS AND METHODS WITH MULTIPLE AND/OR ADAPTIVE PRIMARY COLORS

(71) Applicant: Stereyo BV, Nazareth (BE)

(72) Inventors: Robbie Thielemans, Nazareth (BE); Vince Dundee, Glendale, CA (US)

(73) Assignee: STEREYO BV, Nazareth (BE)

( * ) Notice: Subject to any disclaimer, the term of this patent is extended or adjusted under 35 U.S.C. 154(b) by 0 days.

(21) Appl. No.: 18/545,439

(22) Filed: Dec. 19, 2023

(65) Prior Publication Data

US 2024/0203327 A1    Jun. 20, 2024

Related U.S. Application Data

(63) Continuation-in-part of application No. 18/233,115, filed on Aug. 11, 2023, and a continuation-in-part of application No. 18/351,243, filed on Jul. 12, 2023, and a continuation-in-part of application No. 18/217,201, filed on Jun. 30, 2023, and a continuation-in-part of application No. 18/217,268, filed on Jun. 30, 2023, and a continuation-in-part of application No. 18/217,261, filed on Jun. 30, 2023, and a continuation-in-part of application No.
(Continued)

(51) Int. Cl.
  *G09G 3/32*    (2016.01)
(52) U.S. Cl.
  CPC ....... *G09G 3/32* (2013.01); *G09G 2300/0452* (2013.01); *G09G 2320/0666* (2013.01)

(58) Field of Classification Search
  CPC ............ G09G 3/32; G09G 2300/0452; G09G 2320/0666
  See application file for complete search history.

(56) References Cited

U.S. PATENT DOCUMENTS 5,767,818 A   6/1998 Nishida
6,055,071 A   4/2000 Kuwata et al.
(Continued)

FOREIGN PATENT DOCUMENTS

BE   20195196   3/2019
BE   20195142   7/2019
(Continued)

OTHER PUBLICATIONS

Extended European Search Report from Corresponding European Patent Application No. EP23218353.3, Mar. 26, 2024.
(Continued)

*Primary Examiner* — Muhammad N Edun
(74) *Attorney, Agent, or Firm* — Workman Nydegger

(57) ABSTRACT

A light-emitting display system and methods are provided. The light-emitting display includes a processor and a display having a plurality of light-emitting elements (LEEs). The LEEs comprise at least three basic primary colors, and at least one additional primary color. For at least part of the display system, one of the at least three basic primary colors is replaced by said at least one additional primary color, or said at least one additional primary color is added to and/or in between said at least three basic primary colors. And the processor is configured to perform at least one mathematical operation for adjusting color balance of said LEEs.

18 Claims, 23 Drawing Sheets

Related U.S. Application Data

18/216,459, filed on Jun. 29, 2023, and a continuation-in-part of application No. 18/322,279, filed on May 23, 2023.

(60) Provisional application No. 63/433,646, filed on Dec. 19, 2022.

(56) References Cited

U.S. PATENT DOCUMENTS

| | | |
|---|---|---|
| 6,483,555 B1 | 11/2002 | Thielemans et al. |
| 6,717,625 B1 | 4/2004 | Thielemans |
| 7,015,902 B2 | 3/2006 | Nagai et al. |
| 7,019,721 B2 | 3/2006 | Thielemans et al. |
| 7,071,620 B2 | 7/2006 | Devos et al. |
| 7,071,894 B1 | 7/2006 | Thielemans et al. |
| 7,079,092 B2 | 7/2006 | Tanghe et al. |
| 7,102,601 B2 | 9/2006 | Devos et al. |
| 7,157,838 B2 | 1/2007 | Thielemans et al. |
| 7,176,861 B2 | 2/2007 | Dedene et al. |
| 7,205,729 B2 | 4/2007 | Thielemans et al. |
| 7,227,519 B1 | 6/2007 | Kawase et al. |
| 7,262,753 B2 | 8/2007 | Tanghe et al. |
| 7,301,273 B2 | 11/2007 | Dedene et al. |
| 7,365,720 B2 | 4/2008 | Bouwens et al. |
| 7,443,466 B2 | 10/2008 | Dedene et al. |
| 7,777,691 B1 | 8/2010 | Nimmer et al. |
| D730,309 S | 5/2015 | Hochman et al. |
| 9,069,519 B1 | 6/2015 | Hall |
| D751,998 S | 3/2016 | Hochman et al. |
| 9,380,720 B2 | 6/2016 | Thielemans et al. |
| 9,477,438 B1 | 10/2016 | Hochman et al. |
| D771,844 S | 11/2016 | Hochman et al. |
| 9,524,666 B2 | 12/2016 | Hochman et al. |
| 9,660,403 B2 | 5/2017 | Hochman et al. |
| 10,325,541 B2 | 6/2019 | Hochman et al. |
| 10,333,109 B2 | 6/2019 | Hochman et al. |
| 10,892,297 B2 | 1/2021 | Chae et al. |
| 10,917,679 B2 | 2/2021 | Dunning et al. |
| 11,310,436 B2 | 4/2022 | Hochman et al. |
| 11,328,655 B2 | 5/2022 | Sugiyama et al. |
| 11,445,123 B2 | 9/2022 | Deighton |
| 11,496,726 B2 | 11/2022 | Deighton |
| 11,552,061 B2 | 1/2023 | Chae et al. |
| 11,610,543 B2 | 3/2023 | Thielemans et al. |
| 11,695,907 B2 | 7/2023 | Steudel et al. |
| 11,881,151 B2 | 1/2024 | Thielemans et al. |
| 11,924,560 B2 | 3/2024 | Thielemans et al. |
| 11,948,501 B2 | 4/2024 | Thielemans et al. |
| 11,948,506 B2 | 4/2024 | Thielemans et al. |
| 2002/0163513 A1 | 11/2002 | Tsuji |
| 2003/0095138 A1 | 5/2003 | Kim et al. |
| 2003/0128299 A1 | 7/2003 | Coleman et al. |
| 2003/0133619 A1 | 7/2003 | Wong et al. |
| 2004/0113875 A1 | 6/2004 | Miller et al. |
| 2004/0207315 A1 | 10/2004 | Thielemans et al. |
| 2004/0212582 A1 | 10/2004 | Thielemans et al. |
| 2004/0233125 A1 | 11/2004 | Tanghe et al. |
| 2004/0233148 A1 | 11/2004 | Tanghe et al. |
| 2005/0017922 A1 | 1/2005 | Devos et al. |
| 2005/0052375 A1 | 3/2005 | Devos et al. |
| 2005/0116667 A1 | 6/2005 | Mueller et al. |
| 2005/0122406 A1 | 6/2005 | Voss et al. |
| 2005/0128751 A1 | 6/2005 | Roberge et al. |
| 2005/0133761 A1 | 6/2005 | Thielemans |
| 2005/0134525 A1 | 6/2005 | Tanghe et al. |
| 2005/0134526 A1 | 6/2005 | Willem et al. |
| 2005/0213128 A1 | 9/2005 | Imai et al. |
| 2006/0022914 A1 | 2/2006 | Kimura et al. |
| 2006/0139238 A1 | 6/2006 | Chiba et al. |
| 2006/0290614 A1 | 12/2006 | Nathan et al. |
| 2007/0081357 A1 | 4/2007 | Kim et al. |
| 2007/0241988 A1 | 10/2007 | Zerphy et al. |
| 2007/0253008 A1 | 11/2007 | Edge et al. |
| 2007/0263394 A1 | 11/2007 | Thielemans et al. |
| 2008/0046217 A1 | 2/2008 | Polonskiy et al. |
| 2008/0079816 A1 | 4/2008 | Yen et al. |
| 2008/0111773 A1 | 5/2008 | Tsuge |
| 2008/0165081 A1 | 7/2008 | Lawther et al. |
| 2008/0285981 A1 | 11/2008 | Diab et al. |
| 2009/0009103 A1 | 1/2009 | McKechnie et al. |
| 2009/0066631 A1 | 3/2009 | Lianza |
| 2009/0102769 A1* | 4/2009 | Kouno .................. G09G 3/3648 345/88 |
| 2009/0102957 A1 | 4/2009 | Phelan |
| 2009/0103200 A1 | 4/2009 | Feklistov et al. |
| 2009/0295706 A1 | 12/2009 | Feng |
| 2010/0001648 A1 | 1/2010 | De Clercq et al. |
| 2010/0103200 A1* | 4/2010 | Langendijk ............... H04N 9/67 345/88 |
| 2010/0243025 A1 | 9/2010 | Bhatia et al. |
| 2010/0289783 A1 | 11/2010 | Leppla |
| 2010/0302284 A1 | 12/2010 | Karaki |
| 2010/0309218 A1 | 12/2010 | Suen et al. |
| 2011/0103013 A1 | 5/2011 | Furukawa |
| 2011/0121761 A1 | 5/2011 | Zhao |
| 2011/0176029 A1 | 7/2011 | Boydston et al. |
| 2012/0019633 A1 | 1/2012 | Holley |
| 2012/0033876 A1 | 2/2012 | Momeyer et al. |
| 2012/0062622 A1 | 3/2012 | Koyama et al. |
| 2012/0133837 A1 | 5/2012 | Furukawa |
| 2012/0287289 A1 | 11/2012 | Steinberg et al. |
| 2012/0307243 A1 | 12/2012 | Elliott |
| 2012/0313979 A1 | 12/2012 | Matsuura |
| 2013/0162696 A1 | 6/2013 | Matsumoto |
| 2013/0181884 A1 | 7/2013 | Perkins et al. |
| 2013/0226495 A1 | 8/2013 | Marcu et al. |
| 2013/0249377 A1* | 9/2013 | Hamer .................. G09G 3/3208 313/112 |
| 2013/0272023 A1 | 10/2013 | Lai |
| 2014/0002718 A1 | 1/2014 | Spielberg |
| 2014/0009485 A1 | 1/2014 | Asanuma |
| 2014/0009505 A1 | 1/2014 | Moon et al. |
| 2014/0049571 A1 | 2/2014 | Erinjippurath et al. |
| 2014/0049983 A1 | 2/2014 | Nichol et al. |
| 2014/0125818 A1 | 5/2014 | Friend |
| 2015/0070402 A1 | 3/2015 | Shah et al. |
| 2015/0186097 A1 | 7/2015 | Hall |
| 2015/0229919 A1 | 8/2015 | Weber et al. |
| 2015/0339977 A1 | 11/2015 | Nathan et al. |
| 2015/0348479 A1 | 12/2015 | Kim et al. |
| 2015/0371405 A1 | 12/2015 | Zhao |
| 2016/0078802 A1 | 3/2016 | Liang et al. |
| 2016/0124091 A1 | 5/2016 | Kawahito et al. |
| 2016/0182790 A1 | 6/2016 | Horesh |
| 2016/0275835 A1 | 9/2016 | Yuan et al. |
| 2016/0335958 A1 | 11/2016 | Huang et al. |
| 2017/0032715 A1 | 2/2017 | Sutherland et al. |
| 2017/0032742 A1 | 2/2017 | Piper et al. |
| 2017/0061924 A1 | 3/2017 | Lee et al. |
| 2017/0069871 A1 | 3/2017 | Yim et al. |
| 2017/0171492 A1 | 6/2017 | Naito |
| 2017/0284630 A1 | 10/2017 | Sergenese et al. |
| 2017/0318178 A1 | 11/2017 | Debevec et al. |
| 2018/0018793 A1 | 1/2018 | Min et al. |
| 2018/0060014 A1 | 3/2018 | Son et al. |
| 2018/0090102 A1 | 3/2018 | Chappalli et al. |
| 2018/0091860 A1 | 3/2018 | Stokking et al. |
| 2018/0131160 A1 | 5/2018 | Zhang et al. |
| 2018/0235052 A1 | 8/2018 | Tada |
| 2018/0240409 A1 | 8/2018 | Li et al. |
| 2018/0342224 A1 | 11/2018 | Beon et al. |
| 2019/0064923 A1 | 2/2019 | Taniguchi |
| 2019/0080656 A1 | 3/2019 | Herranz et al. |
| 2019/0098293 A1 | 3/2019 | Lee et al. |
| 2019/0132560 A1 | 5/2019 | Grosse et al. |
| 2019/0172404 A1 | 6/2019 | Zhu |
| 2019/0209858 A1 | 7/2019 | Slaughter et al. |
| 2019/0212719 A1 | 7/2019 | Ono |
| 2019/0213951 A1 | 7/2019 | Li et al. |
| 2019/0244561 A1 | 8/2019 | Zong et al. |
| 2019/0295457 A1 | 9/2019 | Li et al. |
| 2019/0306477 A1 | 10/2019 | Nordback |
| 2019/0356940 A1 | 11/2019 | Mallett |

(56) References Cited

U.S. PATENT DOCUMENTS

| | | |
|---|---|---|
| 2019/0364309 A1 | 11/2019 | Von Braun et al. |
| 2019/0377535 A1 | 12/2019 | Rycyna et al. |
| 2020/0014904 A1 | 1/2020 | Wetzstein et al. |
| 2020/0027386 A1 | 1/2020 | Wang et al. |
| 2020/0037011 A1 | 1/2020 | Zong et al. |
| 2020/0043201 A1 | 2/2020 | Tanaka et al. |
| 2020/0098333 A1 | 3/2020 | Marcu |
| 2020/0126501 A1 | 4/2020 | Yamazaki et al. |
| 2020/0160791 A1 | 5/2020 | Chung |
| 2020/0225903 A1 | 7/2020 | Cohen |
| 2020/0280761 A1 | 9/2020 | Staples |
| 2020/0286424 A1 | 9/2020 | Thielemans et al. |
| 2020/0388210 A1 | 12/2020 | Thielemans et al. |
| 2020/0403117 A1 | 12/2020 | Fabien et al. |
| 2021/0005161 A1 | 1/2021 | Lee |
| 2021/0014385 A1 | 1/2021 | Boggavarapu et al. |
| 2021/0056937 A1 | 2/2021 | Sakai |
| 2021/0124174 A1 | 4/2021 | Tokunaga et al. |
| 2021/0125545 A1 | 4/2021 | Sohn et al. |
| 2021/0125570 A1 | 4/2021 | Kang et al. |
| 2021/0185778 A1 | 6/2021 | Otten |
| 2021/0201769 A1 | 7/2021 | Morris et al. |
| 2021/0217157 A1 | 7/2021 | Han et al. |
| 2021/0225267 A1 | 7/2021 | Thielemans et al. |
| 2021/0227270 A1 | 7/2021 | Braun |
| 2021/0266624 A1 | 8/2021 | Zong et al. |
| 2021/0295766 A1 | 9/2021 | Sugiyama et al. |
| 2021/0297717 A1 | 9/2021 | Braun |
| 2021/0306394 A1 | 9/2021 | Zong et al. |
| 2021/0321032 A1 | 10/2021 | Braun |
| 2021/0345058 A1 | 11/2021 | Itakura et al. |
| 2021/0366411 A1 | 11/2021 | Yang et al. |
| 2021/0383842 A1 | 12/2021 | Han et al. |
| 2021/0397398 A1 | 12/2021 | Han et al. |
| 2022/0014728 A1 | 1/2022 | Deighton |
| 2022/0020727 A1 | 1/2022 | Noh et al. |
| 2022/0059045 A1 | 2/2022 | Kobayashi et al. |
| 2022/0059607 A1 | 2/2022 | Murugan et al. |
| 2022/0060612 A1 | 2/2022 | Hochman et al. |
| 2022/0076615 A1 | 3/2022 | Ding et al. |
| 2022/0103738 A1 | 3/2022 | Deighton |
| 2022/0150456 A1 | 5/2022 | Steudel et al. |
| 2022/0191109 A1 | 6/2022 | Chen et al. |
| 2022/0246670 A1 | 8/2022 | Chen et al. |
| 2022/0254317 A1 | 8/2022 | Hochman et al. |
| 2022/0350562 A1 | 11/2022 | Wang et al. |
| 2022/0375387 A1 | 11/2022 | Deighton |
| 2022/0375403 A1 | 11/2022 | Cheng et al. |
| 2022/0413790 A1 | 12/2022 | Cai et al. |
| 2023/0013582 A1 | 1/2023 | Wang et al. |
| 2023/0154399 A1 | 5/2023 | Thielemans et al. |
| 2023/0162400 A1 | 5/2023 | Liu et al. |
| 2023/0162662 A1 | 5/2023 | Zhang et al. |
| 2023/0163142 A1 | 5/2023 | Lu et al. |
| 2023/0186821 A1 | 6/2023 | Hashempour et al. |
| 2023/0209207 A1 | 6/2023 | Hochman et al. |
| 2023/0274693 A1 | 8/2023 | Thielemans et al. |
| 2023/0282153 A1 | 9/2023 | Thielemans et al. |
| 2023/0298503 A1 | 9/2023 | Zhang et al. |
| 2023/0326175 A1 | 10/2023 | Zhang et al. |
| 2024/0022686 A1 | 1/2024 | Thielemans et al. |
| 2024/0044465 A1 | 2/2024 | Thielemans et al. |

FOREIGN PATENT DOCUMENTS

| | | |
|---|---|---|
| BE | 1026226 A1 | 11/2019 |
| CN | 102290003 A | 12/2011 |
| CN | 206741357 U | 12/2017 |
| CN | 207352560 U | 5/2018 |
| CN | 110602875 A | 12/2019 |
| CN | 110617000 A | 12/2019 |
| DE | 102006054856 A1 | 1/2009 |
| EP | 1172783 A1 | 1/2002 |
| EP | 1780798 A1 | 5/2007 |
| EP | 2323072 A1 | 5/2011 |
| EP | 3099058 A1 | 11/2016 |
| EP | 3139422 A2 | 3/2017 |
| GB | 2469819 A | 11/2010 |
| JP | 2007062892 A | 3/2007 |
| JP | 2019214445 A | 12/2019 |
| KR | 20170065163 A | 6/2017 |
| TW | 200608327 A | 3/2006 |
| TW | 200608328 A | 3/2006 |
| WO | 2013186278 A1 | 12/2013 |
| WO | 2015114720 A1 | 8/2015 |
| WO | 2018164105 A1 | 9/2018 |
| WO | 2019215219 A1 | 11/2019 |
| WO | 2020253249 A1 | 12/2020 |
| WO | 2021009719 A1 | 1/2021 |
| WO | 2022013191 A1 | 1/2022 |
| WO | 2022064062 A1 | 3/2022 |
| WO | 2022087322 A1 | 4/2022 |

OTHER PUBLICATIONS

Belgian Search Report from Belgian Patent Application No. BE202305595, Nov. 21, 2023.
Response to Belgian Search Report from Belgian Patent Application No. BE2023/5595, filed Mar. 21, 2024.
Extended European Search Report from European Patent Application No. EP23185674.1, Nov. 16, 2023.
Partial European Search Report from European Patent Application No. EP23198096, Nov. 29, 2023.
Extended European Search Report from European Patent Application No. EP23198096.2, Apr. 9, 2024.
Extended European Search Report from European Patent Application No. EP23190432.7, Feb. 12, 2024.
Extended European Search Report from European Patent Application No. EP23160521, Jul. 6, 2023.
Response to Extended European Search Report from European Patent Application No. EP23160521, dated Jan. 29, 2024.
Extended European Search Report from European Patent Application No. EP23218322.8, Mar. 27, 2024.
Extended European Search Report from European Patent Application No. EP23218336.8, Apr. 10, 2024.
Partial European Search Report from European Patent Application No. EP23218348.3, Apr. 30, 2024.
Extended European Search Report from European Patent Application No. EP23218353.3, Mar. 26, 2024.
Extended European Search Report from European Patent Application No. EP23218356.6, Apr. 5, 2024.
Extended European Search Report from European Patent Application No. EP23218377.2, Apr. 24, 2024.
Baker, Simon, "Pulse Width Modulation (PWM)", Mar. 17, 2015, 13 pages, TFT Central.
Burr, David, "Motion Perception: Human Psychophysics", Apr. 18, 2013, pp. 763-776, MIT Press.
Cast, Inc., "Understanding—and Reducing—Latency in Video Compression Systems", Oct. 25, 2013, 7 pages, retrieved from <https://web.archive.org/web/20131025202911/https://www.design-reuse.com/articles/33005/understanding-latency-in-video-compression-systems.html>.
Davis et al., "Humans perceive flicker artifacts at 500 Hz", Feb. 3, 2015, 4 pages, Nature, Scientific Reports.
Kang et al., "Nanoimprinted Semitransparent Metal Electrodes and Their Application in Organic Light-Emitting Diodes," May 21, 2007, 6 pages, Advanced Materials.
Larson, Jennifer, "How Many Frames Per Second Can the Human Eye See?", Oct. 20, 2020, 12 pages, retrieved from <https://www.healthline.com/health/human-eye-fps>.
Lee et al., "Solution-Processed Metal Nanowire Mesh Transparent Electrodes", Jan. 12, 2008, pp. 689-692, Nano Letters, vol. 8, No. 2.
Mackin et al., "High Frame Rates and the Visibility of Motion Artifacts", Jun. 30, 2017, 19 pages, SMPTE Motion Imaging Journal, vol. 126, Issue 5.
Thielemans, Robbie, "Displays Applications of LEDs", Handbook of Visual Display Technology, May 21, 2011, 14 pages.

(56) References Cited

OTHER PUBLICATIONS

Thielemans, Robbie, "LED Display Applications and Design Considerations", Handbook of Visual Display Technology, May 21, 2011, 5 pages, retrieved from https://link.springer.com/referenceworkentry/10.1007/978-3-540-79567-4_76.
Tobii Connect, "The speed of human visual perception", Sep. 14, 2022, 1 page, retrieved from <https://connect.tobii.com/s/article/the-speed-of-human-perception?language=en_US>.
Wilson, Derek, "Exploring Input Lag Inside Out", Jul. 16, 2019, 2 pages, retrieved from <https://www.anandtech.com/show/2803>.
Zhang, Yin, "Performance Characteristics of Lithium Coin Cells for Use in Wireless Sensing Systems", Jun. 17, 2012, 143 pages, All Theses and Dissertations, Brigham Young University.
"The Ins and Outs of HDR—Gamma Curves", Jun. 8, 2020, 3 pages, retrieved from <https://www.eizoglobal.com/library/management/ins-and-outs-of-hdr/index2.html>.
Extended European Search Report from corresponding EP Application No. EP18198749.6, Nov. 12, 2018.
International Search Report and Written Opinion from PCT Application No. PCT/EP2019/061804, Jun. 13, 2019.
Applicant's Amendment/Remarks filed at the EPO on Feb. 20, 2020 for PCT/EP2019/061804.
Applicant's Amendment/Remarks filed at the EPO on May 26, 2020 for PCT/EP2019/061804.
International Preliminary Report on Patentability from PCT/EP2019/061804, Jul. 10, 2020.
Belgian Search Report from BE Application No. 201905196, Aug. 13, 2019.
Search Report for BE 2019/05759 mailed Jan. 23, 2020, 18 pages.
Belgian Search Report for Belgian Patent Application No. BE2019/5970, Jul. 24, 2020.
Response to Belgian Search Report for Belgian Patent Application No. BE2019/5970, filed by Applicant at the Belgian Patent Office on Nov. 24, 2020.
Belgian Search Report from corresponding Belgian Application No. BE 202205007, Jun. 7, 2022.
Extended European Search Report from corresponding EP Application No. 22185014.2, Dec. 8, 2022.
Office Action from European Application No. 19722133.6, Jan. 19, 2023.
Wikipedia, "MAC Address", 10 pages, retrieved from <https://en.wikipedia.org/wiki/MAC_address>, retrieved May 30, 2023.

\* cited by examiner

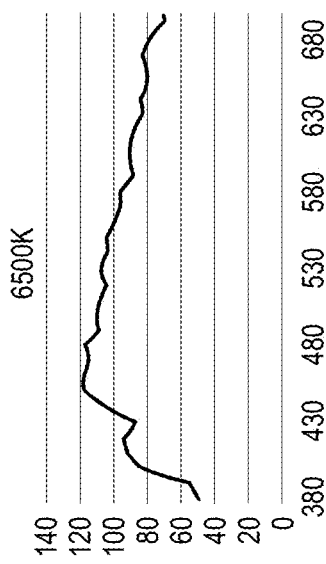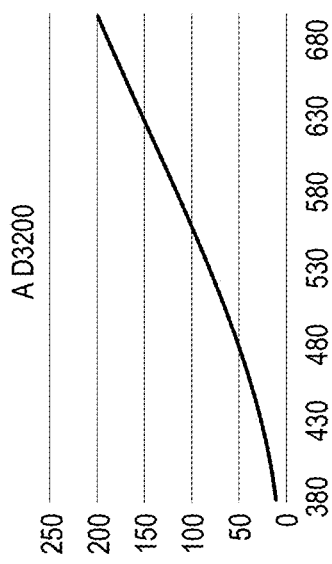

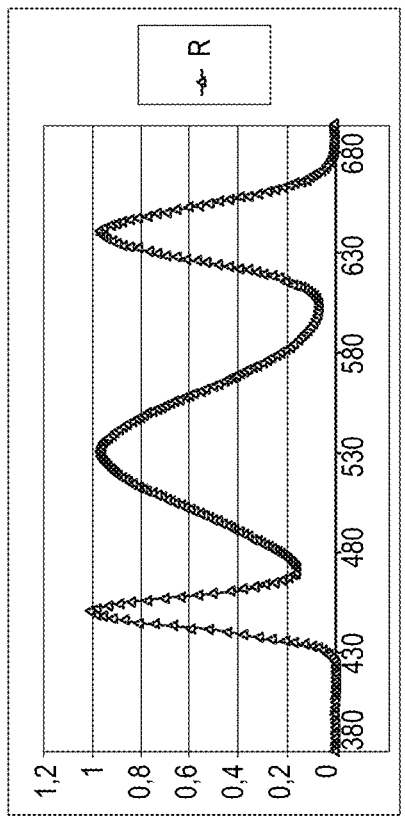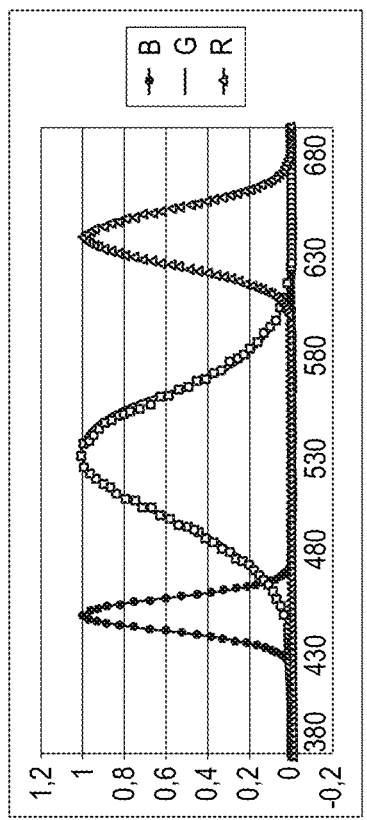
FIG. 5B

DISPLAY SYSTEMS AND METHODS WITH MULTIPLE AND/OR ADAPTIVE PRIMARY COLORS

CROSS-REFERENCE TO RELATED APPLICATIONS

This application claims the benefit of and priority to U.S. Provisional Patent Application Ser. No. 63/433,646 filed on Dec. 19, 2022 and entitled "Modular Display with Integrated on Camera Feature Sets," which is expressly incorporated herein by reference. This application is also a continuation-in-part of and claims priority to each of the following applications: U.S. application Ser. No. 18/322,279, filed May 23, 2023; U.S. application Ser. No. 18/351,243, filed Jul. 12, 2023; U.S. application Ser. No. 18/216,459, filed Jun. 29, 2023; U.S. application Ser. No. 18/217,201, filed Jun. 30, 2023; U.S. application Ser. No. 18/217,261, filed Jun. 30, 2023; U.S. application Ser. No. 18/217,268, filed Jun. 30, 2023; and U.S. application Ser. No. 18/233,115, filed Aug. 11, 2023, the contents of each of which are expressly incorporated herein by reference.

TECHNICAL FIELD

This disclosure relates to a light source display being adapted for better color matching applications, in particular for use in a studio environment comprising a camera recording images being displayed on the light source display. The disclosure also relates to corresponding methods for improved color matching.

BACKGROUND

In a typical studio set-up, comprising a display and a camera recording images being displayed by the display, the visual perception for the human eye might be heavily disturbed since the color perception of the human eye is different from that of a camera. Therefore, extra colors can be added (e.g. cyan, orange) to the display or e.g. LED-wall, such that the disturbance is eliminated, and the human eye visual perception is corrected and hence satisfactory. Adding extra colors to the display means in fact adding multiple color spectral elements. The multiple spectral elements will enable the display to be capable of making use of the color theory called "metamerism" wherein it is possible to show the same perceived color using completely different spectral settings.

In fact, this "challenge" is part of a broader aspect of display and light sources for photography and video applications. The display in a studio environment also acts as a light source whether this is desired or not. The light spectrum of typical Light Emitting Diode (LED) illumination devices, such as typical Red-Green-Blue (RGB) LED devices, is fixed and does not match to the light spectrum of, for example, natural sunlight or of industry-standard white light sources, such as halogen lamps, tungsten lamps, and fluorescent lamps. Therefore, when using LED illumination devices, the resulting reflected light may not match that of natural sunlight or industry-standard light sources. Consequently, the reflected imagery that results from the LED illumination devices may not appear correctly as perceived by the human eye or as captured by a still camera or video camera (e.g., standard film or digital image capture), as compared with the reflected imagery that results from natural sunlight or standard light sources. While it may be possible to apply manual filtering in combination with the LED illumination, manual filtering is not adequate to provide matching for all colors.

For these reasons, the inventors have found that further approaches are needed for enabling the widespread use of LED illumination in, for example, display applications. Therefore, a need exists for a system and corresponding method for matching the spectrum of a multi-color LED illumination device, or a display comprising such illumination device, to the spectrum of any white light source to eliminate color mismatch and disturbances in for instance a studio environment.

SUMMARY OF THE INVENTION

In general, an object of this disclosure is to provide a system and corresponding method for matching the spectrum of a multi-color illumination device, such as a LED illumination device, or a display comprising such an illumination device, to the spectrum of any white light source to eliminate color mismatch and disturbances in for instance studio applications comprising such display.

In a first aspect of the invention is provided a light-emitting display system, comprising a processor and a display having a plurality of light-emitting elements (LEEs). The LEEs comprise at least three basic primary colors, and at least one additional primary color. Moreover, either, for at least part of the display system, one of the at least three basic primary colors is replaced by the at least one additional primary color, or else, the at least one additional primary color is added to and in between the at least three basic primary colors. As a result, the display system (as well as the LEEs) comprises at least four primary colors. It is hence noted that particularly for part of the display or display system (and thus not for the entire display or display system) one of the at least three basic primary colors can be replaced by the at least one additional primary color. Otherwise, the situation could lead to a display or display system having at least three primary colors, of which one of the basic primary colors is being replaced by an additional primary color, which would be contradictory to the fact that the LEEs comprise at least four primary colors, i.e. at least three basic and at least one additional primary color. It is noted that when at least one additional primary color is added to and/or in between the at least three basic primary colors, the option could also be considered of possibly adapting the die size of one of the at least one additional primary color. For example, the die size of the additional primary color could be increased to herewith improve the efficiency (in light/color output) of the die. The display system, in particular, is configured to perform at least one mathematical operation for adjusting color balance of the LEEs.

According to an embodiment, the processor (of the display system) is configured to perform at least one mathematical operation for adjusting color balance of the LEEs. The at least three basic primary colors are for example Red, Green and Blue, whereas the at least one additional primary color is for example Amber or White. According to an embodiment, Amber and White are both added as additional primary color.

The light-emitting display system may comprise digital logic and/or digital circuits, all or not as being part of the processor.

The processor may be embedded within an active receiver card, and the active receiver card may further comprise a first interface and a second interface. The first interface may be configured to receive a serialized video data stream as input from a video processing system, and the processor may be configured to extract a corresponding pixel value from the serialized video data stream, and perform the at least one mathematical operation on the corresponding pixel value.

According to an embodiment, gamma processing is provided, and/or the processor provides gamma processing. According to an embodiment, time dependent calibration is provided, and/or the processor provides time dependent calibration. According to an embodiment, content dependent calibration is provided, and/or the processor provides content dependent calibration.

One can appreciate that the embodiments of the first aspect of the invention as mentioned above, may be combined or a combination of the elements or features of the various embodiments leading to further embodiments is also possible.

In a second aspect of the invention is provided a light-emitting display system, comprising a processor and a display having a plurality of light-emitting elements (LEEs). The LEEs comprise at least three basic primary colors, and the display has a first color output at a first drive current. The display system is configured to change the first drive current to a second drive current in a vertical sync frame, defined as a frame wherein a new or update image is shown on the display after receiving a vertical sync signal, such that the first color output can be changed to a second color output. The first color output can be interpreted as the existing color output of the display system, whereas the second color output is then the new color output. The display system is configured to perform at least one mathematical operation for calculating the second output color dependent on the second drive current. Further, the display system is configured to perform at least one mathematical operation for adjusting color balance of the LEEs. According to an embodiment of the second aspect invention, the processor (of the display system) is configured to perform at least one mathematical operation for adjusting color balance of the LEEs. The at least three basic primary colors are for example Red, Green and Blue. The display system may further comprise at least one additional primary color, such for example Amber or White The at least three basic primary colors are for example Red, Green and Blue, whereas the at least one additional primary color is for example Amber or White. According to an embodiment, Amber and White are both added as additional primary color.

The light-emitting display system may comprise digital logic and/or digital circuits, all or not as being part of the processor.

According to a further embodiment, at least once the first drive current is changed to the second drive current, in order to change the first color output of the display to the second color output, the second drive current, for example, being a desired drive current to obtain the second, desired color output. According to a particular embodiment thereof, such change of the first drive current and the first color output is performed for improving the interplay of the display with a camera recording images being displayed by the display (of the display system). Taking into account that the camera has a shutter and corresponding shutter opening time, the change may occur either in or out of the camera shutter opening time.

One can appreciate that the embodiments of the second aspect of the invention as mentioned above, may be combined or a combination of the elements or features of the various embodiments leading to further embodiments is also possible.

In a third aspect of the invention is provided a hardware storage device having stored thereon computer-executable instructions which, when executed by one or more processors of a display system according to the first aspect, or according to the second aspect of the invention, cause the processor(s) to perform the at least one mathematical operation for adjusting the color balance of the LEEs.

In a fourth aspect of the invention, a display method is provided comprising: providing a light-emitting display system according to the first or second aspect of the invention; and performing by the processor the at least one mathematical operation for adjusting the color balance of the LEEs.

In a fifth aspect of the invention, a display method is provided comprising: (i) providing a light-emitting display system according to the second aspect of the invention; (ii) changing the first drive current to a second drive current in a vertical sync frame, defined as a frame wherein a new image is shown on the display after receiving a vertical sync signal, such that the first color output can be changed to a second color output; (iii) performing by the processor the at least one mathematical operation for calculating the second color output dependent on the second drive current; and (iv) performing by the processor the at least one mathematical operation for adjusting color balance of the LEEs.

In a sixth aspect of the invention, a hardware storage device having stored thereon computer-executable instructions which, when executed by one or more processors of a display system according to the second aspect of the invention, cause the processor to (a) change the first drive current to a second drive current in a vertical sync frame, defined as a frame wherein a new image is shown on the display after receiving a vertical sync signal, such that the first color output can be changed to a second color output; (b) perform by the processor the at least one mathematical operation for calculating the second color output dependent on the second drive current; and (c) perform by the processor the at least one mathematical operation for adjusting color balance of the LEEs.

One can appreciate that although aspects of the invention are mentioned above, other aspects of the invention implementing single elements or a combination of the elements of the various expressly described aspects are possible.

BRIEF DESCRIPTION OF THE DRAWINGS

FIG. 1, including FIG. 1A, FIG. 1B, FIG. 1C-1, FIG. 1C-2, FIG. 1D-1, FIG. 1D2, and FIG. 1E show sunlight spectra in (FIG. 1A) at sunset and (FIG. 1B) for sun at noon, and ColorChecker charts in (FIG. 1C-1, FIG. 1C-2) Macbeth and (FIG. 1D-1 and FIG. 1D2) Munsell, including CRI formula in (FIG. 1E), to perform color matching, determine settings and calculations.

FIG. 2 and enlarged portions shown in FIGS. 2A, 2B, 2C, 2D, and 2E illustrate a schematic overview of a spectral analysis system for matching the spectrum of a multi-spectral display (with multi-color LEDs) to the spectrum of any white light source.

FIG. 5A, FIG. 5B, FIG. 5C, FIG. 5D, FIG. 5E, and FIG. 5F illustrate an RGB example calculation sheet, comprising for different types of RGB LEDs corresponding color spectra and color triangle with the CIE chromaticity diagram.

DETAILED DESCRIPTION

Figure 2:
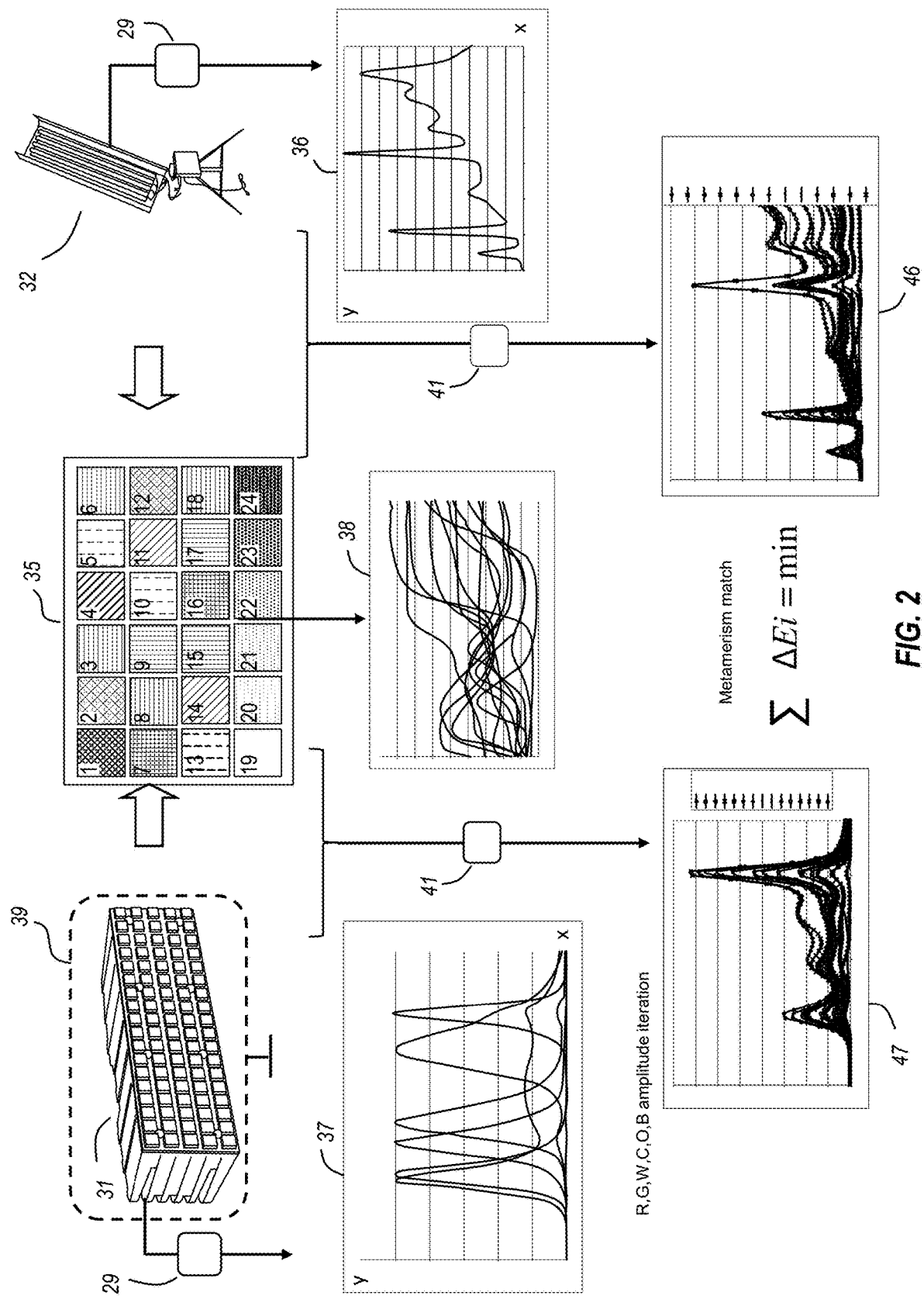

As described herein, according to a first embodiment, a light-emitting display system comprises a processor and a display having a plurality of light-emitting elements (LEEs). The LEEs comprise at least three basic primary colors, and at least one additional primary color. Moreover, either, for part of the display system, one of the at least three basic primary colors is replaced by the at least one additional primary color, or else, the at least one additional primary color is added to and in between the at least three basic primary colors. As a result, the display system (as well as the LEEs) comprises at least four primary colors. It is hence noted that particularly for part of the display or display system (and thus not for the entire display or display system) one of the at least three basic primary colors can be replaced by the at least one additional primary color. Otherwise, the situation could lead to a display or display system having at least three primary colors, of which one of the basic primary colors is being replaced by an additional primary color, which would be contradictory to the fact that the LEEs comprise at least four primary colors, i.e. at least three basic and at least one additional primary color. It is noted that when at least one additional primary color is added to and in between the at least three basic primary colors, the option could also be considered of possibly adapting the die size of one of the at least one additional primary color. For example, the die size of the additional primary color could be increased to herewith improve the efficiency (in light/color output) of the die. The display system is configured to perform at least one mathematical operation for adjusting color balance of the LEEs.

According to another embodiment, the processor (of the display system) is configured to perform at least one mathematical operation for adjusting color balance of the LEEs. The at least three basic primary colors are for example Red, Green and Blue, whereas the at least one additional primary color is for example Amber or White. According to an embodiment, Amber and White are both added as additional primary color.

LEEs with multiple/mixed colors to produce white light need electronic circuits to control the blending of the colors. The at least three basic primary colors (RGB) combine to form white light. The tint of white depends on the color temperature of the light. When color temperature is high, more blue light exists. When color temperature is low, there's more red light. By applying light or color balancing, artificial lighting can be corrected, so colors appear more natural. For example, by blocking most of the blue portion of the spectrum transmitted by cool white LED lamps, an object being inspected has a more natural look to the human eye. Other than the mathematical function e.g. via the display system's processor or computer software, in accordance with the invention, correcting color by means of light or color balancing can be performed by e.g. using optics such as light balancing filters. One of the advantages of using a software solution, e.g., by means of the mathematical operations of the invention, instead of state-of-the-art hardware options, such as using optical filters, is for example that you can choose the way to optimize. Once the relevant values for the LEEs are achieved, a full calculation of the desired outcome can be made. That could mean for example a full optimization towards high color rendering (which in the optical case either requires a filter, in general not being removable, or else requires cumbersome handling to remove and/or replace elements or components). Alternatively, this could also lead to a full calculation on how to drive the LEEs for the most light output, or it may result in an intermediate calculation meaning e.g. optimizing for 60% in CRI and for another 30% in light output.

A display system, or a display, or even a display unit (e.g. being part of a display or a display system), can be considered "active" when it comprises a processor or processing unit. While referring to U.S. patent application Ser. No. 18/322,279, filed at the USPTO on May 23, 2023 (also referred to by Applicant as "Cluster A—Active Receiver Card" application), which is incorporated herein by reference, such processor can be referred to as or may comprise an active receiver card. Hence, an active display system is for example a display system comprising an active receiver card (or a plurality thereof). As further mentioned in U.S. patent application Ser. No. 18/322,279, the active receiver card comprises a processor, a first and a second interface, wherein (i) the first interface may be configured to receive a serialized video data stream as input from a video processing system, (ii) the processor may be configured to extract a corresponding pixel value from the serialized video data stream, and to perform at least one mathematical operation on the corresponding pixel value.

Whereas the display system in accordance with an embodiment comprises a processor or processing unit, the display system can be considered or referred to as "active". Hence, in case of an active light-emitting display system, it is the processor which can make the display system an "active" display system, and not the device or element from the display system that performs the at least one mathematical operation for adjusting color balance of the LEEs. According to an embodiment, the processor is embedded within an active receiver card, further comprising a first interface and a second interface. The first interface may be configured to receive a serialized video data stream as input from a video processing system, and the processor may be configured to extract a corresponding pixel value from the serialized video data stream, and to perform the at least one mathematical operation on the corresponding pixel value.

The display system in accordance with first or second aspect of the invention, may comprise digital logic and/or digital circuits, possibly being part of the processor, e.g. for performing the at least one mathematical operation. According to an embodiment, and in line with U.S. patent application Ser. No. 18/322,279, digital logic (or a processor, a controller, or other circuitry) may be implemented to determine an (a, b) coordinate pair out of data communicated along the video data stream and compare the (a, b) coordinate with an (x, y) coordinate. The digital logic may also (i) retrieve the corresponding pixel data from the data communicated along the video data stream, (ii) perform at least one mathematical operation on the retrieved data, (iii) convert the outcome of the mathematical operation to logic that can interface with the second electrical interface, and/or (iv) send corresponding signals to the board containing one or more LEDs to light up the LED in correspondence with the outcome of the mathematical operation. In an embodiment, at least one mathematical operation may be performed on the retrieved pixel data. Such operations can include, but are not limited to, correction of the brightness, gamma correction, color correction, or subdelta correction of the display system. Other operations may include a calibration, a content-dependent calibration, a time-dependent calibration, a scaling function, and/or a rotation function. Or, in other words, other operations may include calibrating the display (of the display system) dependent on the content of the digital serialized video data stream or the timing of the stream, and further operations may include scaling or rotation of the video data. According to an embodiment, the display system provides gamma processing.

As used herein and throughout this disclosure, a processor, or what may be "digital logic" or "a process unit" is used to refer generally to what is understood to be hardware digital logic, digital logic circuitry, control circuitry, or other circuitry or controlling circuitry, a microprocessor, or one or more processors, controllers or computing devices, based on software or circuitry, that operate based on received or stored instructions, such hardware being formed of one or more integrated circuits or otherwise, which may be implemented on a single metal-oxide-semiconductor integrated circuit chip or otherwise, which may include electronic components, for example, transistors, diodes, resistors, gates, relays, switches, amplifiers, inverters, buffers, and/or capacitors, etc., that are used to receive, process, perform logical operations on, mathematical operations, algorithmic operations, calculations, and/or store signals, data, and/or information, including digital and/or analog signals, or continuous or non-continuous signals, and output one or more signals based thereon.

Moreover, in line with U.S. patent application Ser. No. 18/322,279, according to an embodiment, a processor based on digital logic may be present to determine a predefined start to light up the LEDs within one video frame and/or to determine a predefined stop to light up the LEDs. Further, non-volatile memory may be included to store the predefined start and the predefined stop. The digital logic, a processor, a controller, or other circuitry may also read the non-volatile memory and, at power-up, read the non-volatile memory to determine the predefined start and the predefined stop. Multiple such starts and stops may be used in one image frame. According to yet another embodiment, the video processing system may comprise volatile memory to at least store pixel information before or after the performance of the aforementioned mathematical operation. Digital logic, a processor, a controller, or other circuitry may also perform (i) gamma correction, (ii) calibration, (iii) autodetection, (iv) the reading and writing of data to and from volatile memory, and (v) the storing of measurement data instead of calibration data.

According to an embodiment, the display system provides content dependent calibration. The principle of content dependent calibration is for example described by the same Applicant in U.S. patent application Ser. No. 16/813,113, and U.S. patent application Ser. No. 18/100,198, both having priority date of Mar. 7, 2019 (also referred to as the "Stretch" and "Stretch calibration" application respectively), wherein calibration principles are used for achieving the desired color to display. It is noted that the content dependent calibration as explained in the "Stretch" application can be used to create the correct color perception.

According to an embodiment, the display system provides time dependent calibration. As for example stated in U.S. patent application Ser. No. 17/865,096 (which is referred to herein as the "Studio2" application), filed at the USPTO on Jul. 14, 2022, time or timing dependent calibration can be enabled wherein colors (calibration) are adjusted during e.g. camera shutter opening time, of a camera recording images being displayed on a display, for example in a studio environment. The principles for time dependent calibration may relate to the emission spectrum of the LEDs, the camera color response, and the desired camera output.

A video data stream, wherein the order of the data communicated along the video data stream need not be communicated sequentially as long as the data is in a predetermined and fixed order, can be generated by a laptop, Personal Computer (PC), or any other existing device that has a graphical engine or Graphics Processing Unit (GPU) incorporated therein. The Graphical User Interface (GUI) for adjusting screen settings may also be integrated in the existing GUI of the graphical engines of the existing device with a graphical engine or GPU. According to an alternative embodiment, the aforementioned mathematical operations may be a part of the GPU system for rendering content to be displayed on the LEDs. According to an embodiment, the video data stream may also contain an upstream communication channel to individual communicate with one or more LEDs or LED tiles via an active receiver card. The data communicated along the video data stream may also be replaced by partially rendered data.

In another embodiment a light-emitting display system is provided, comprising a processor and a display having a plurality of light-emitting elements (LEEs). The LEEs comprise at least three basic primary colors, and the display has a first color output at a first drive current. The display system is configured to change the first drive current to a second drive current in a vertical sync frame, defined as a frame wherein a new or update image is shown on the display after receiving a vertical sync signal, such that the first color output can be changed to a second color output. The first color output can be interpreted as the existing color output of the display system, whereas the second color output is then the new color output. The display system is configured to perform at least one mathematical operation for calculating the second output color dependent on the second drive current. Further, the display system is configured to perform at least one mathematical operation for adjusting color balance of the LEEs. Color balance is the global adjustment of the intensities of colors (typically Red, Green, and Blue primary colors). An important goal of this adjustment is to render specific colors—particularly neutral colors like white or gray—correctly. Hence, the general method is sometimes called gray balance, neutral balance, or white balance. Color balance may change the overall mixture of colors in an image and can be used for color correction. It is noted that another option could be to take it a step further (herewith referring in particular to calibration principles as e.g. described by the same Applicant in U.S. patent application Ser. No. 16/813,113, and U.S. patent application Ser. No. 18/100,198, both having priority date of Mar. 7, 2019 (also referred to as the "Stretch" and "Stretch calibration" application respectively)) In this specific case, the primary colors are first calibrated to target primary colors and the 'intensities' of these targets primary colors (after calibration) are used to obtain desired color balance (e.g. D6500 white as white balance color temperature). It is further noted that color balance is as such not limited to 'white' (as mentioned above), but a balance towards any desired color can also be targeted.

The terminology of vertical sync signal and vertical sync frame is now explained, while herewith also referring to the Applicant's U.S. patent application Ser. No. 16/895,872 (which is referred to herein as the "Studio display" application), filed at the USPTO on Jun. 8, 2020, including U.S. patent application Ser. No. 17/865,096 (which is referred to herein as the "Studio2" application), filed at the USPTO on Jul. 14, 2022. In U.S. patent application Ser. No. 16/895,872, for example, the following is mentioned regarding frame rate latency. In case of action on the 'background' and in relation to foreground action or triggers, it is needed that the background action (on screen of the display) is totally synchronized with the audio and actor performance in front of the screen. Traditionally this was compensated for by having the background play out a few frames earlier compared to the front action, to compensate for the frame delay of the video display system. Linked thereto, what is deemed very useful is that the display can show the video (refresh the video) related to vertical sync update, i.e. a synchronization update of the images coming in vertically and being updated on the screen or display. The update time is programmable compared to the fixed position of the sync signal. This means that whenever sync comes, the display waits certain amount of programmed 'clock' before updating the screen. This feature is very useful for determining and finding optimal exposure timings on the camera to make sure the 'grabbing' and or A/D conversion (transfer signal or content to digital value) in the camera takes place when the PWM driven screen is started, and hence light emitting elements of the display (or e.g. LEDs of the LED display) will light up. On one hand, the camera has a particular so-called shutter-time (comparable with diaphragm on a lens). On the other hand, the images or video data is scanned vertically onto the screen or display, meaning that the images appear in vertical sequence. The camera shutter-time may be defined such that only part or a ribbon of the entire screen is viewed on camera. In case this part or ribbon coincides with not yet received new images entering from top to bottom of the screen, then nothing shall be seen within this part or ribbon. It may be that there are always provided new images or video data within the ribbon, representing the shutter-time of the camera. In other words, a synchronization is provided by means of having a programmable update time of new entering images or the sync signal with which new images are scanned. The programmable aspect implies that it can be programmed such that certain amount of time is waited until images are viewed or represented. Hence, vertical sync signal can be defined as the synchronization signal of images appearing in vertical sequence, whereas vertical sync frame can be defined as the synchronization frame of such vertical sequence appearance.

According to an embodiment of the first or second aspect invention, the processor (of the display system) is configured to perform at least one mathematical operation for adjusting color balance of the LEEs. The at least three basic primary colors are for example Red, Green and Blue. The display system may further comprise at least one additional primary color, such for example Amber or White According to a further embodiment, at least once the first drive current is changed to the second drive current, in order to change the first color output of the display to the second color output, the second drive current being a desired drive current to obtain the second, desired color output. According to a particular embodiment thereof, such change of the first drive current and the first color output is performed for improving the interplay of the display with a camera recording images being displayed by the display (of the display system). Taking into account that the camera has a shutter and corresponding shutter opening time, the change may occur either in or out of the camera shutter opening time.

This patent application builds further on the same Applicant's earlier filed U.S. patent application Ser. No. 16/895,872, filed at the USPTO on Jun. 8, 2020, and published as US 2020/0388210 A1 (which is referred to herein as the "Studio display" application), the contents of which are incorporated herein by reference, and U.S. patent application Ser. No. 17/865,096 (which is referred to herein as the "Studio2" application), filed at the USPTO on Jul. 14, 2022, which claims the benefit of priority to U.S. Provisional Patent Application 63/221,822, which was filed at the USPTO on Jul. 14, 2021, the contents of each of which are incorporated herein by reference.

Building on the concepts of these previous applications, the present disclosure further focuses on the system and integration of the "on camera feature sets", which means for on-camera use of a display system where the image displayed by the display or display system is captured by one or more cameras (for instance in a studio environment) and herewith taking into account the required specifications. Particular Focus is made on the display system (and not only/necessarily on the camera, although the camera can be part of embodiments described with the invention), which may be modular in this case, as this is most complex to handle (as compared to non-modular). As used herein, a modular display system is meant that just one display can be considered, or a plurality of displays can be combined to appear together as one (large) screen or unity. Hence, the display system can be as small or as big as wanted, or as the particular application of the display system requires. Nevertheless, it can also be done on non-modular displays, for example, one single display to be used as such (e.g., stand-alone), not in combination with other displays. A particular object of this disclosure is to provide a system, a method, implementation and chipset for on camera use of the display system (for instance, in a studio environment) related to: video lighting device with increased and adaptive color rendering index (CRI) for on stage applications, in particular e.g. on stage camera applications.

Figure 3:
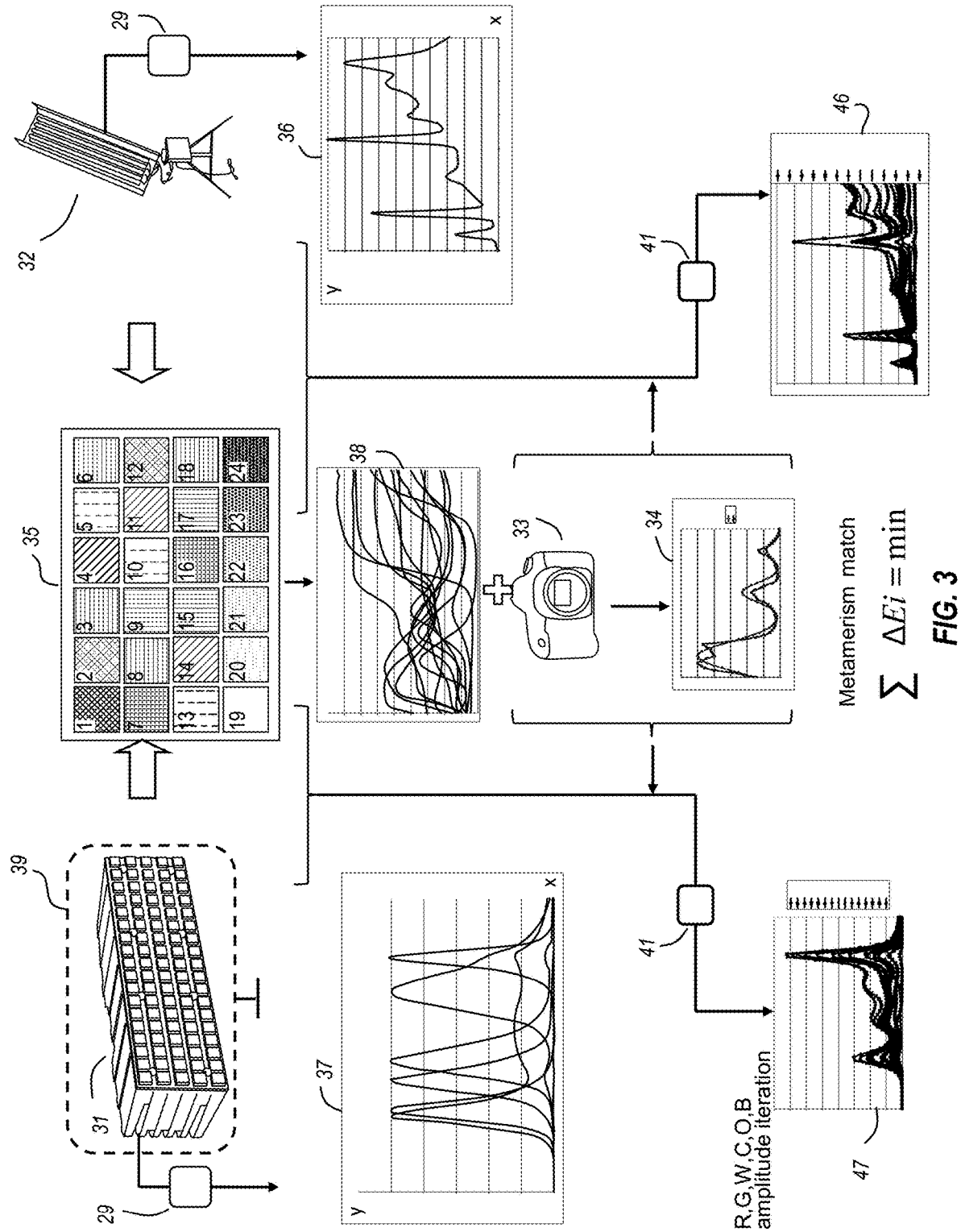
FIG. 3 and enlarged portion shown in FIG. 3A illustrate a schematic overview of a spectral analysis system for matching the spectrum of a multi-spectral display (with multi-color LEDs) to the spectrum of any white light source whilst also taking into account the camera sensitivities.
Figure 5A:
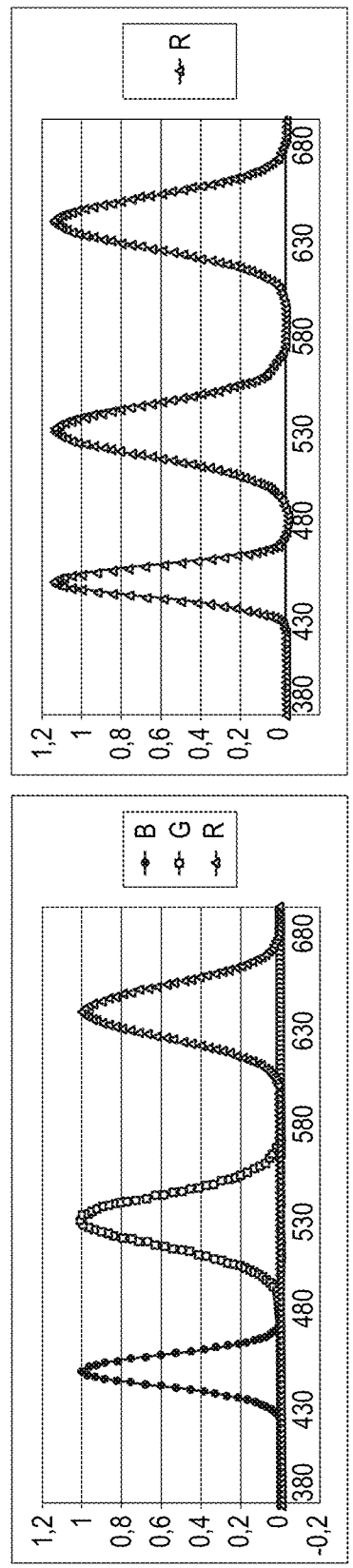
Figure 5C:
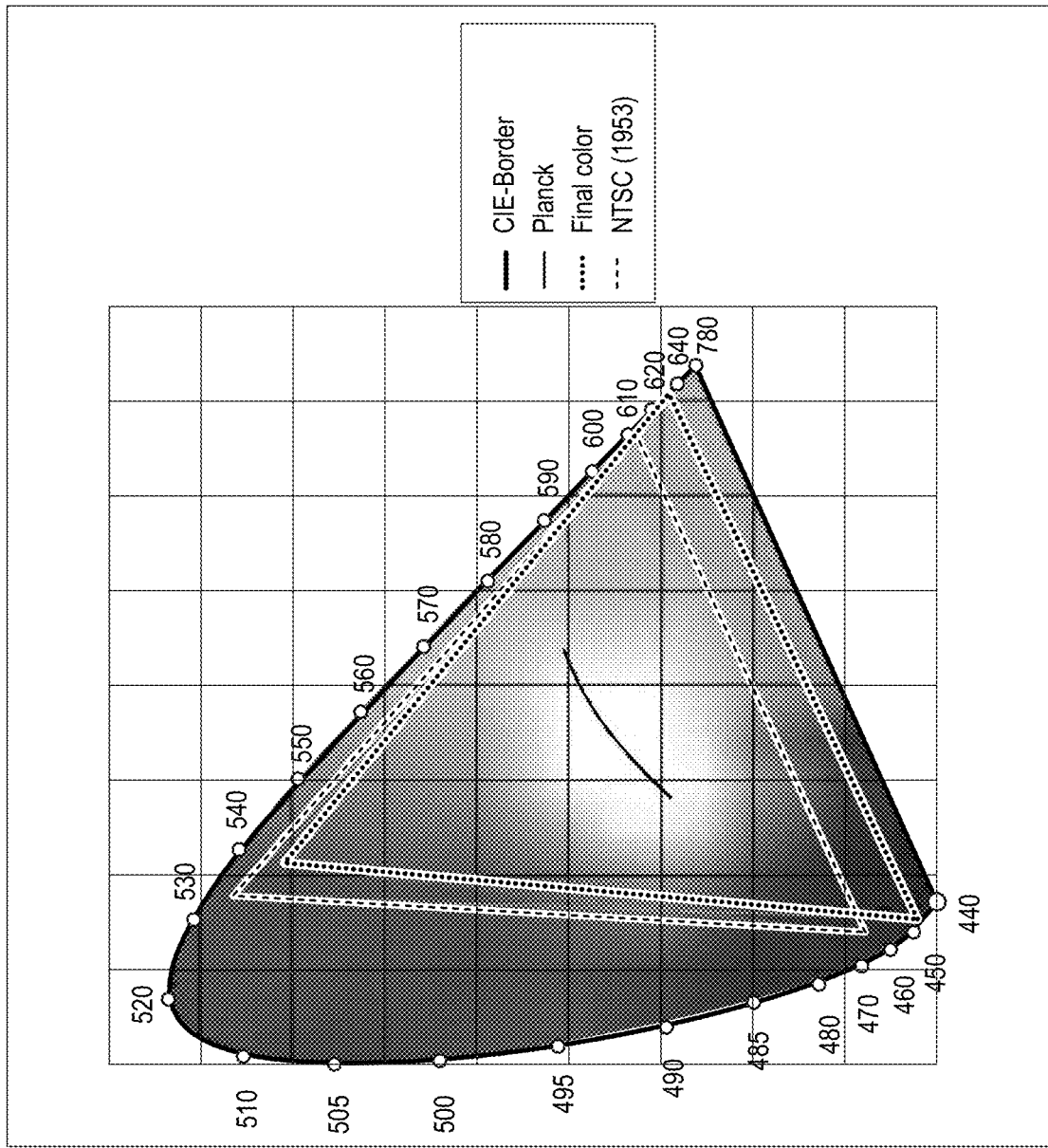
Figure 5D:
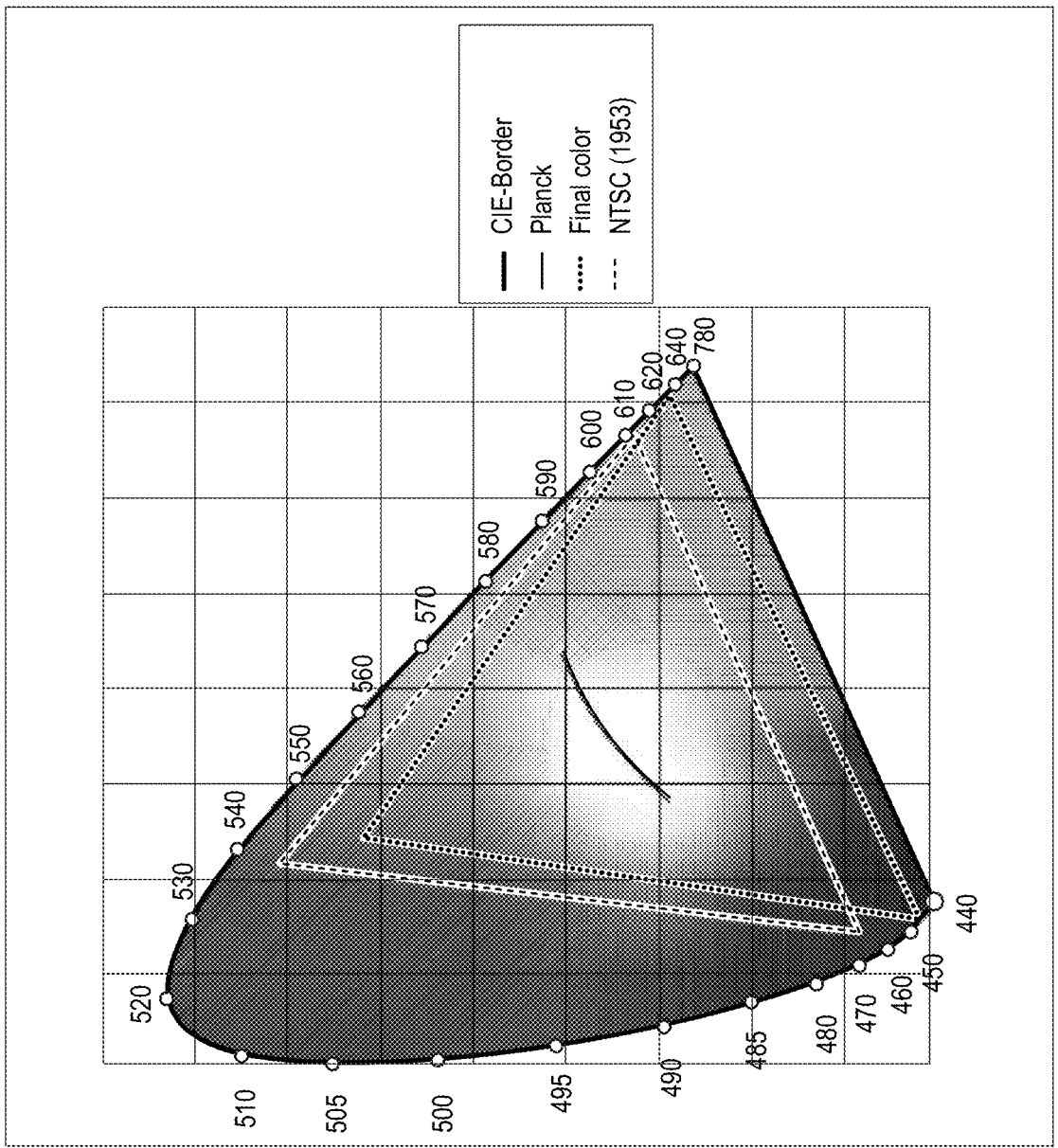
Figure 5E:
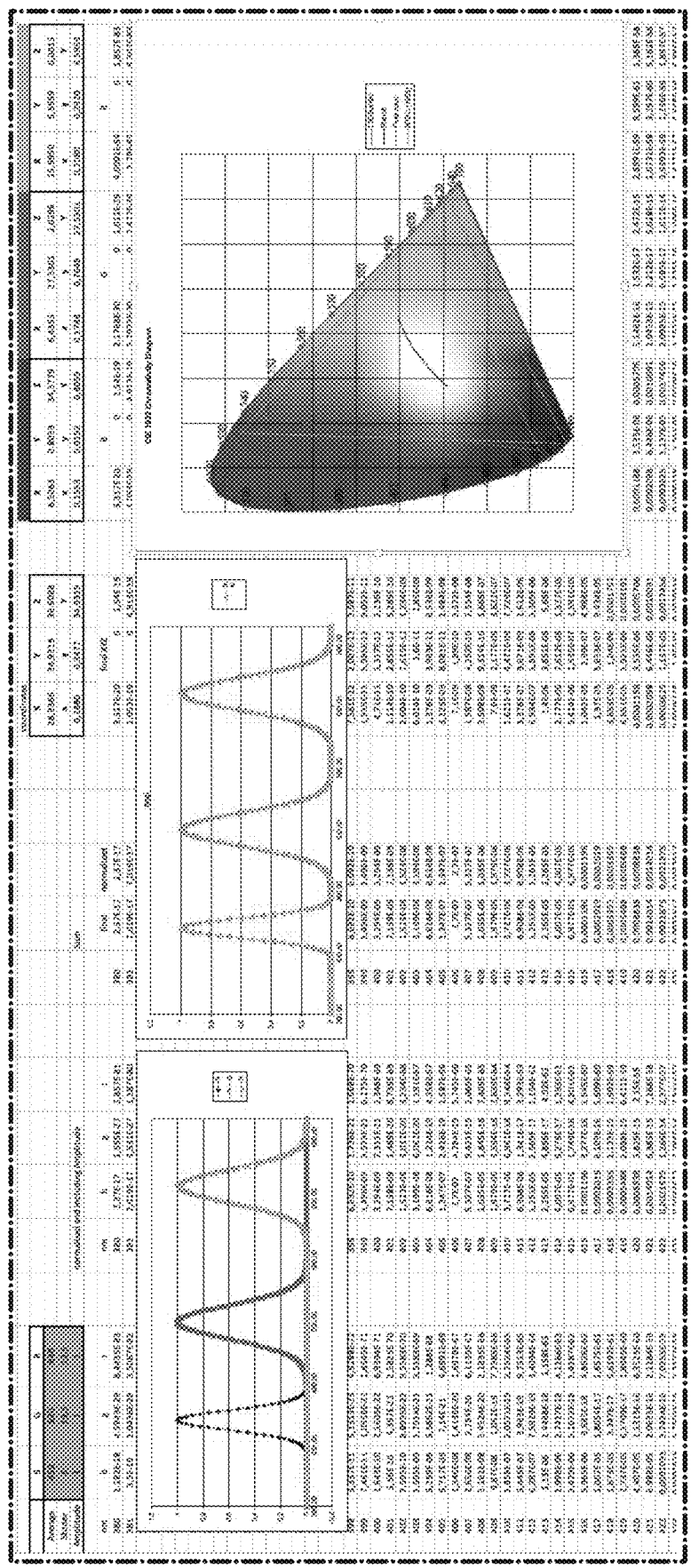
Figure 5F:
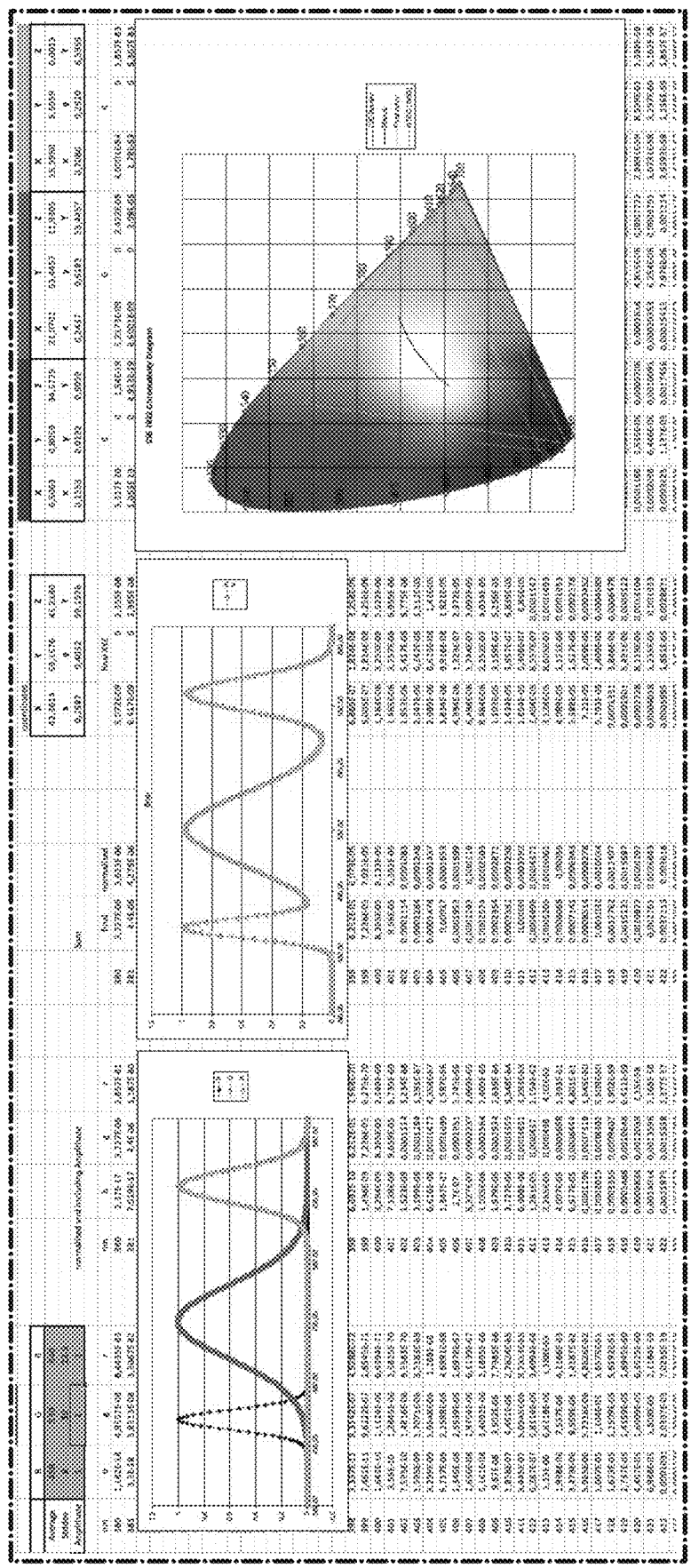
Figure 6:
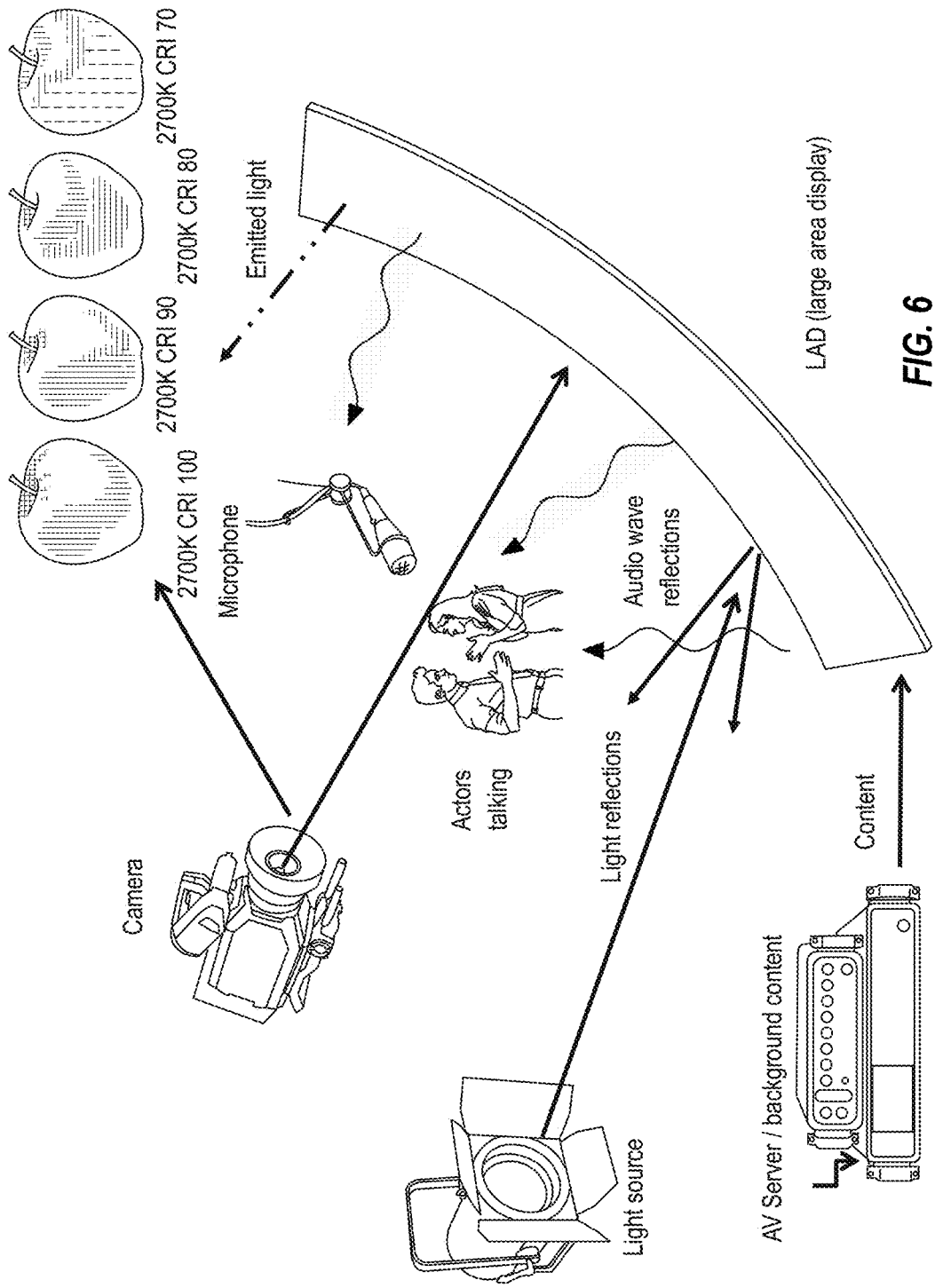
FIG. 6 illustrates a studio setting, wherein a camera is surveying actors talking and a display wall of which the noise is suppressed or reduced by means of for example fan regulation or light output adaptation, and wherein the display wall can be provided with acoustic absorbing or diffusing material, or the display wall may have an open structure, such that audio wave reflections from the surface of the display wall can be suppressed or reduced.

Reference is made to FIGS. 1 to 6. In the "Studio display" application (U.S. patent application Ser. No. 16/895,872, from the same Applicant) it is explained how to match color settings to desired settings of a light. As shown in FIG. 6, not only audio wave and light reflections need to be taken care of, but also the light that is emitted by the display (or in particular its illumination device). For example, in FIG. 6, the camera (with its own sensitivity, for example, in FIG. 3 given by spectrum 34) looks at and images the apples that are being lit by the image that is emitted from the display (see dashed-dotted line arrow). The image could be for example "sun at noon moving" having a spectrum as depicted in FIG. 1A, or "sunset" (tungsten like) having a spectrum as depicted in FIG. 1B. Both images being both "daylight" but at different times of the day. FIGS. 1A and 1B show the respective spectra for irradiance or photon energy of the daylight in function of wavelength. In order to match color settings of a lamp (such as, e.g., the illumination device of a display) and do the necessary calculations, a first assumption to be made is that the lamp has a certain emission spectrum. Then, as a first step, sunlight, such as, e.g., in FIG. 1B, can be directed to a ColorChecker chart amongst which for example MacBeth chart in FIG. 1C-1 (which is shown in hatching to identify the different colors in FIG. 1C-2) or Munsell chart in FIG. 1D-1 (which is shown in hatching to identify the different colors). It is noted that such a ColorChecker chart and a MacBeth chart are known to one of ordinary skill in the art. Colors can be measured such that reference colors can be defined. A color pallet is now known, which should be approached as best as possible with the lamp. This means that all the light in the spectrum of the lamp or light source needs to be as close as possible to, for example, FIG. 1A or 1B. In FIG. 6 the apples are also part of the scene. In case the camera or the viewer is a human eye, the traditional CRI (color rendering index, known as a measurement of how natural colors render under an artificial white light source when compared with sunlight) definition can be used, of which the general formula is given in FIG. 1E.

Figure 2A:
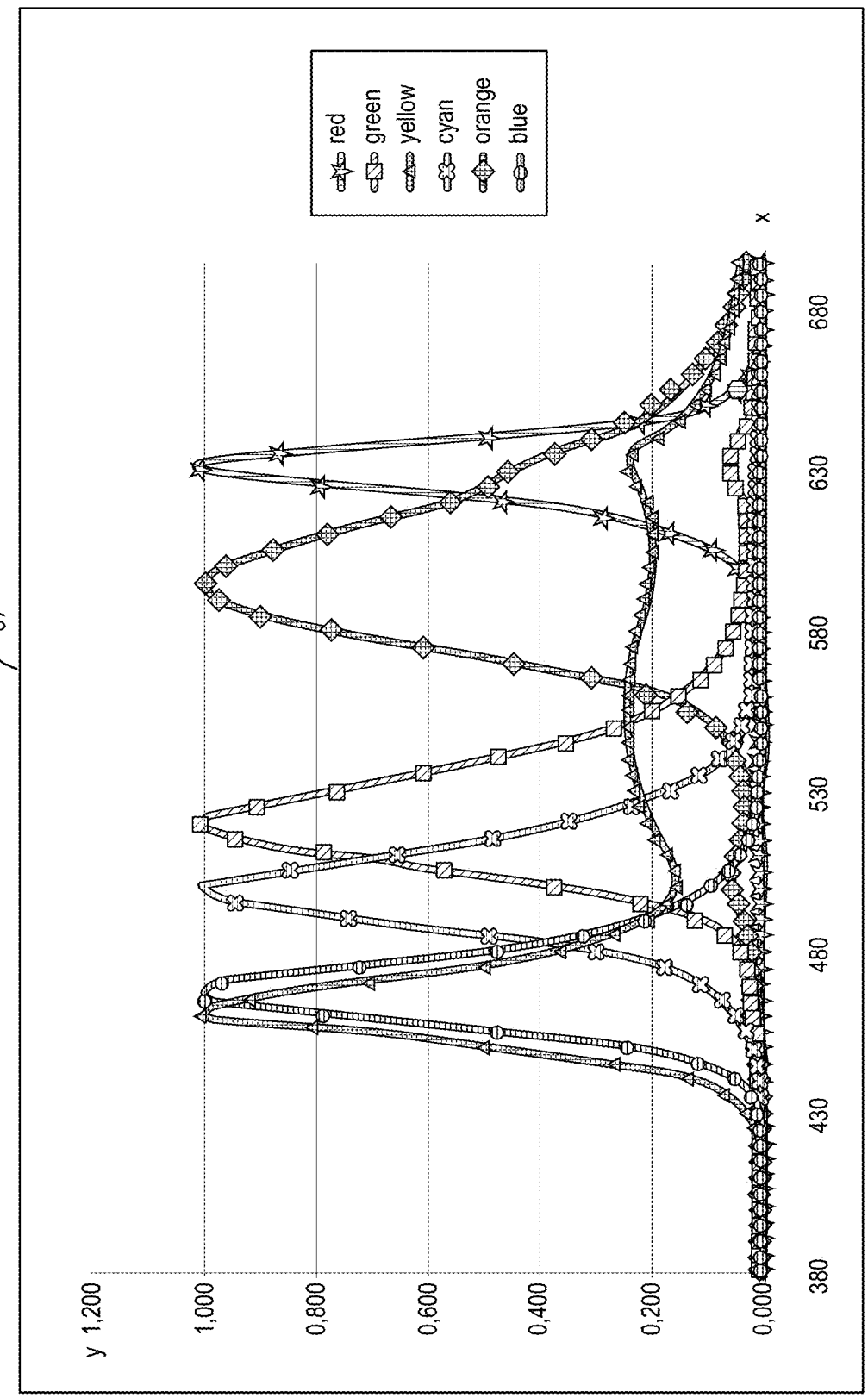
Figure 2B:
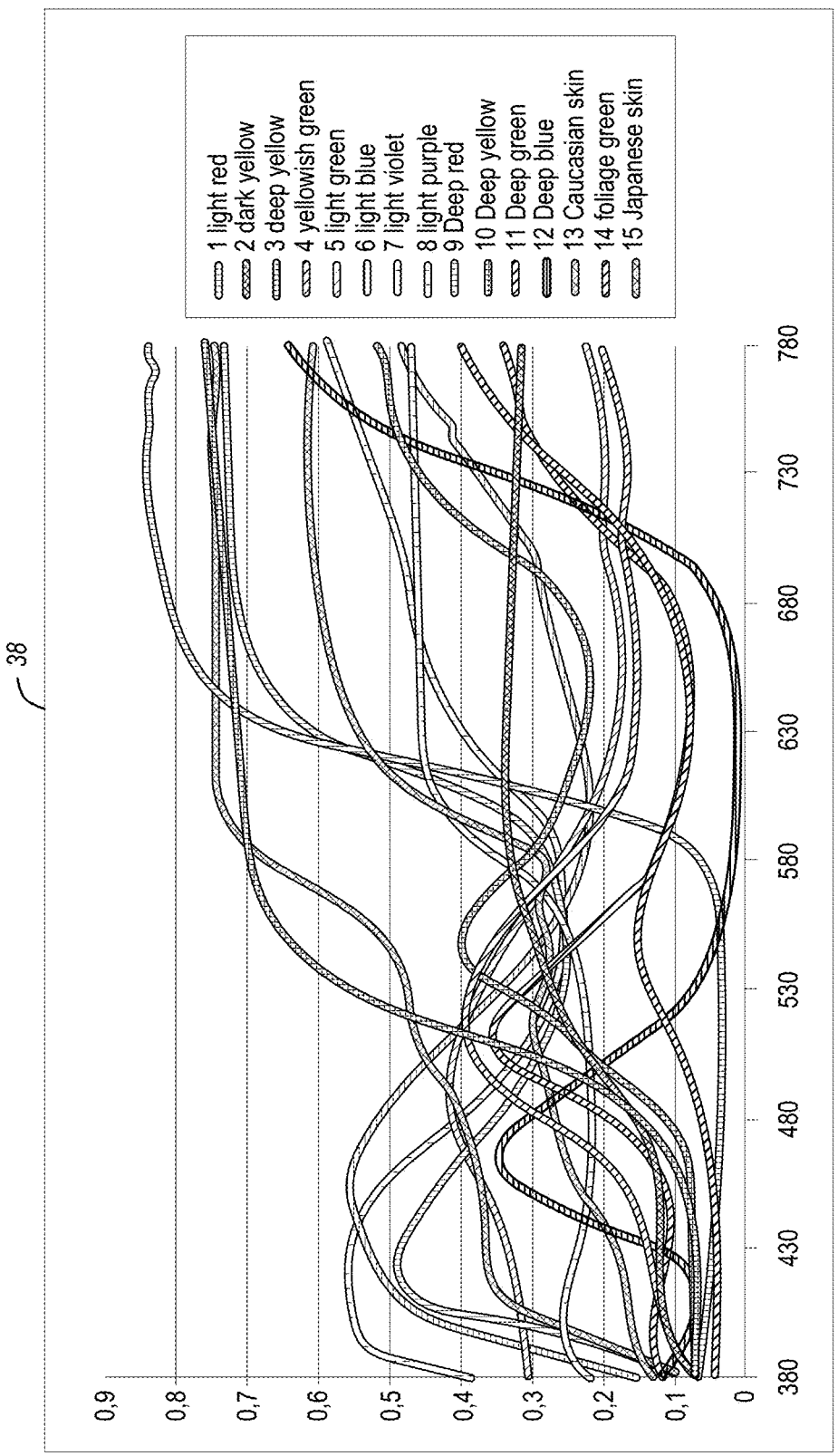
Figure 2C:
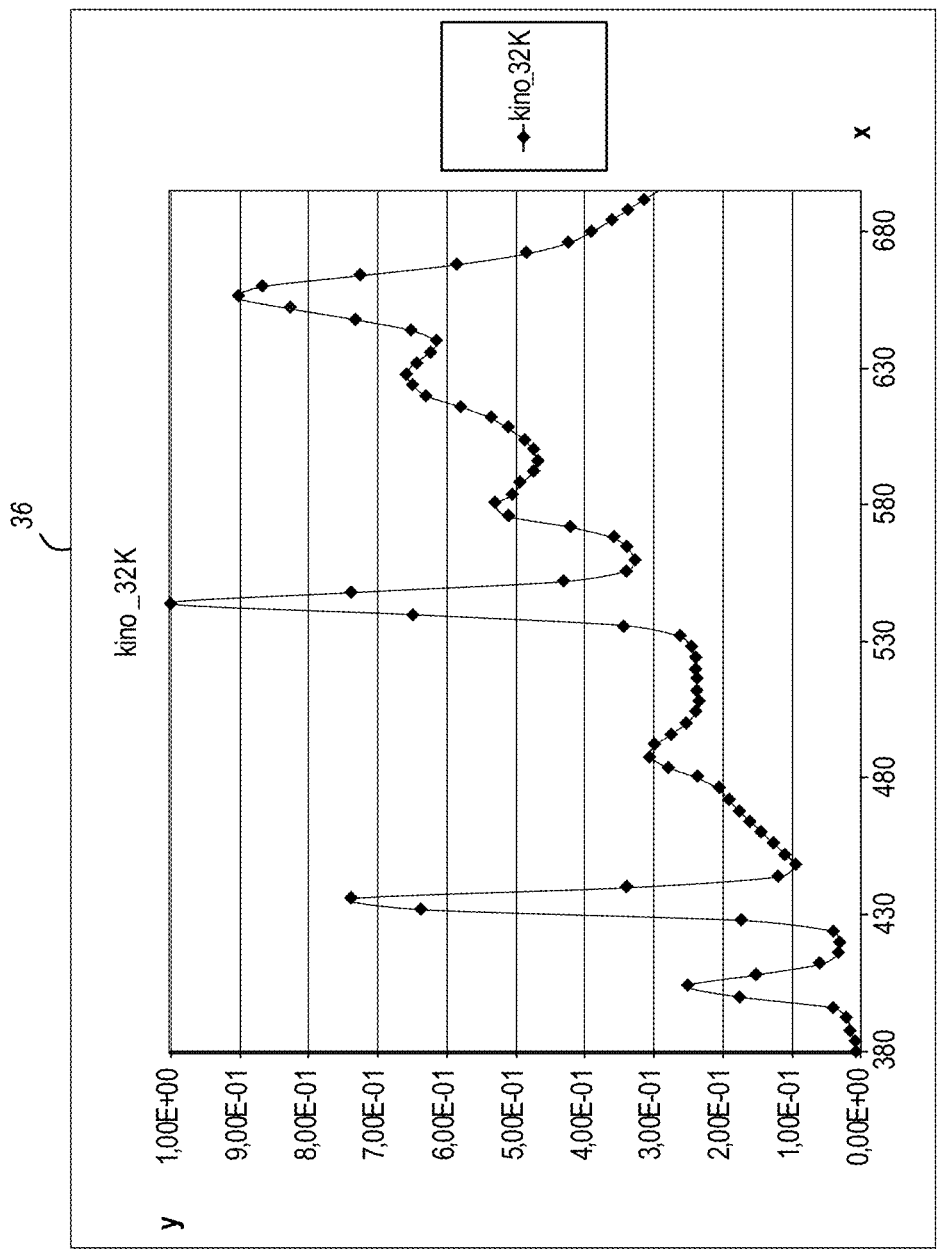
Figure 2D:
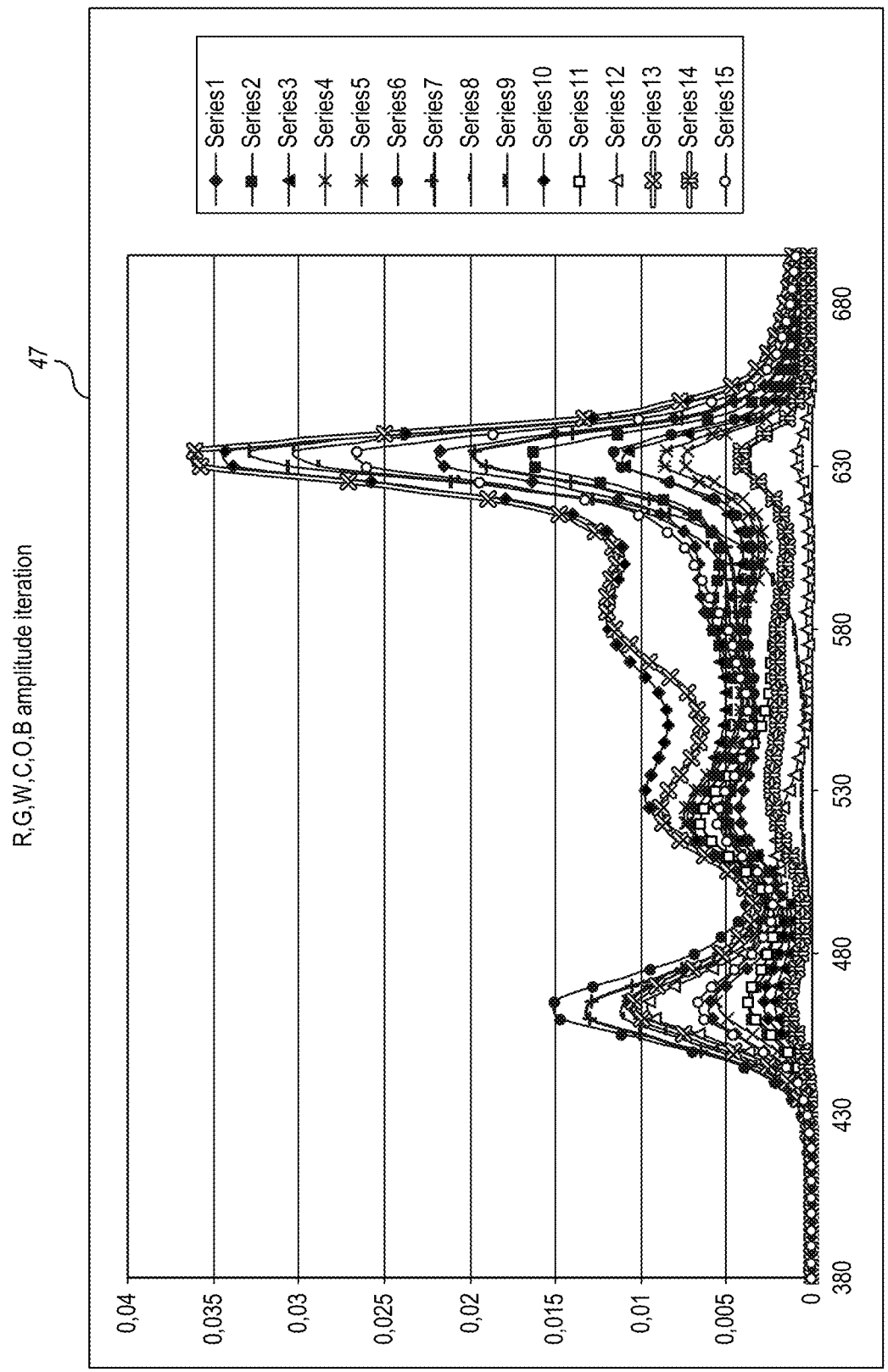
Figure 2E:
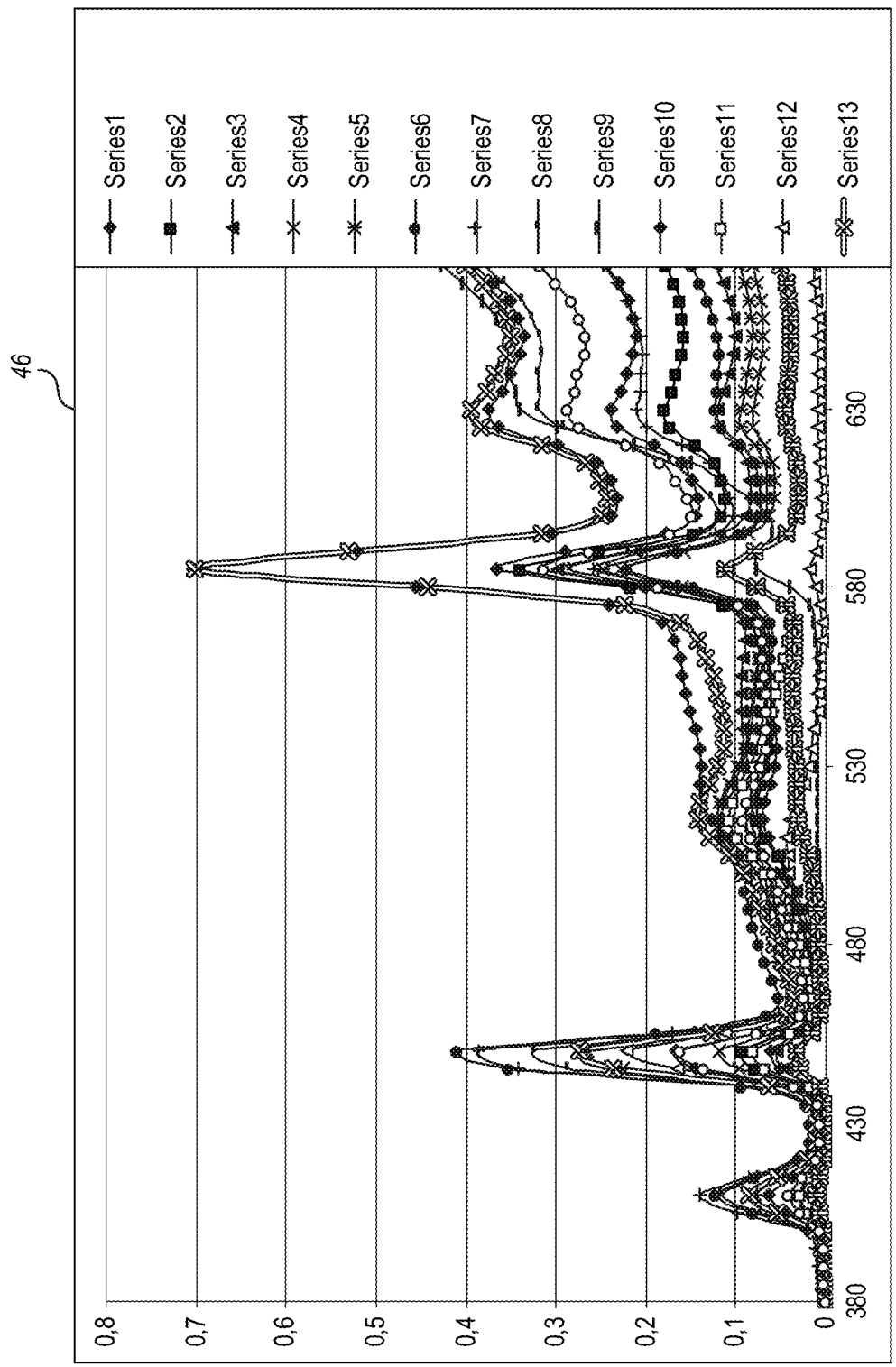
Figure 3A:
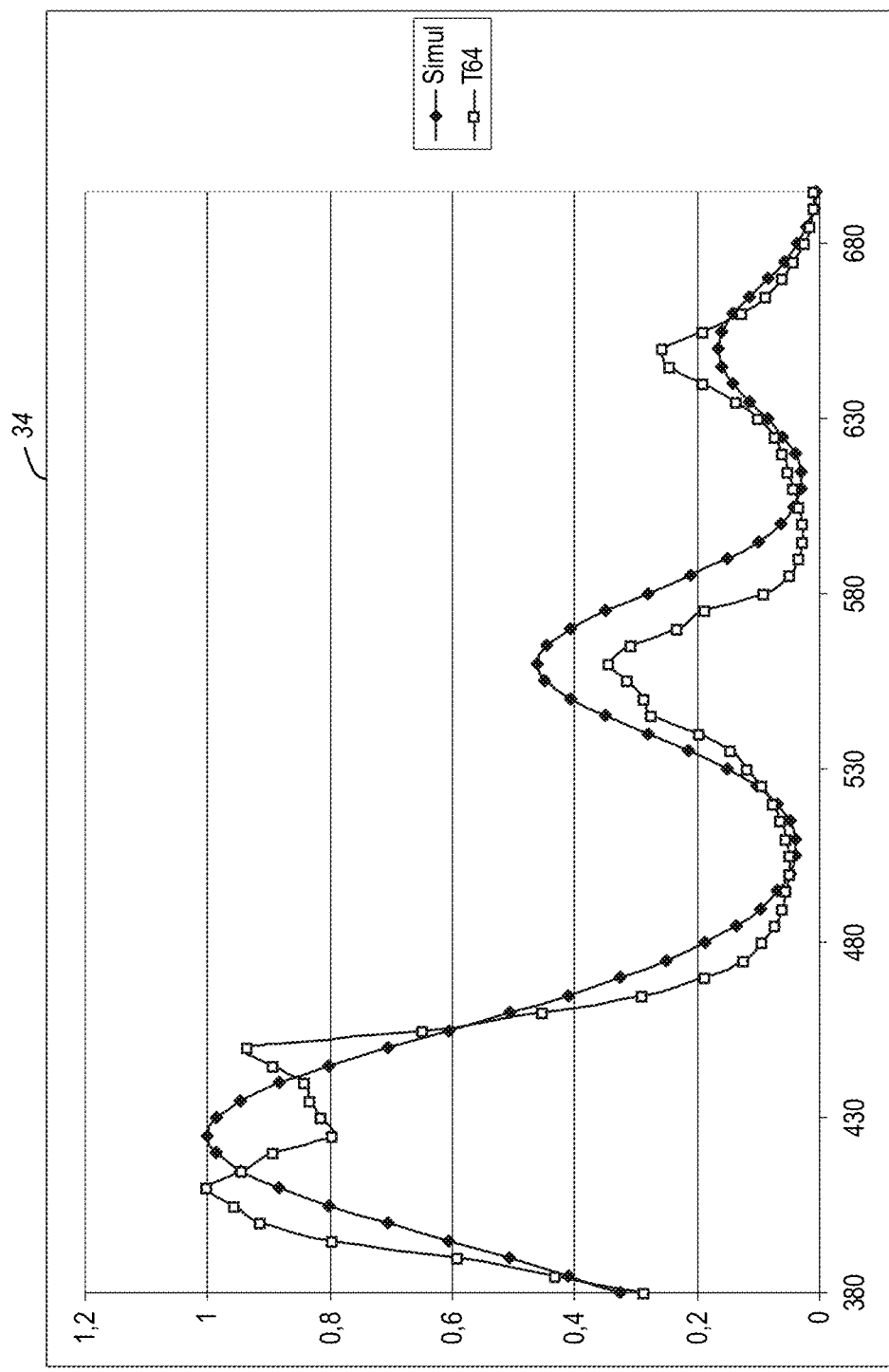

A spectra analysis system is schematically shown in FIG. 2 and FIG. 3 respectively, which includes a reference light source 32 that may be any commercially available white light source, such as, but not limited to, one or more commercially available halogen lamps, tungsten lamps, fluorescent lamps, hydrargyrum medium-arc iodide (HMI) lamps, and any combinations thereof. For example, reference light source may be a Kino Flo 3200 fluorescent lamp from Kino Flo Inc. (Burbank, Calif.) or a Lowell 3200 tungsten lamp from Lowel-Light Manufacturing, Inc. (Brooklyn, N.Y.); where 3200 refers to a lamp color temperature of 3200 Kelvin (K). Additionally, a reference light source may be representative of natural sunlight. FIG. 2 illustrates how to set all particular individual colors for the display 39 and/or (its) light source 31 e.g. LED lamp, to the desired spectrum of the Kino Flo lamp 32. In this particular case, a commercial lamp 32 (i.e. the Kino Flo lamp) is used, but it could be replaced by the sunlight spectra as discussed before. Spectra analysis system further includes a multi-color LED light source 31 (e.g., as part of the display 39) that is, for example, an LED white light source that is formed of at least the combination of RGB plus one additional color, i.e. a 4-color LED light source. Preferably, multi-color LED light source 31 is an LED white light source that is formed of the combination of RGB plus three additional colors, i.e. a 6-color LED light source. In one example, multi-color LED light source 31 is a 6-color modular LED lighting device. More specifically, the colors that form the 6-color modular LED lighting device may include, but are not limited to, Red, Green, White, Cyan, Orange, and Blue, as for example shown by the light spectrum 37. An enlarged showing of light spectrum 37 is shown in FIG. 2A. Typically, light sources are characterized by their spectral power distribution (SPD). An SPD can be measured by a spectrophotometer 29, and is plotted by power as a function of wavelength. An SPD, here, e.g., light spectrum 37, plots the total output power of a light source, here, e.g., 6-color LED light source 31. An SPD in the form of light spectrum 36 is also plotted for the commercial Kino Flo lamp 32. An enlarged showing of light spectrum 36 is shown in FIG. 2C. For each wavelength or wavelength band, the SPD outlines how much optical power the light source emits. Wavelength (in nm) is shown on the x-axis, whereas spectral power is distributed on the y-axis (measured in Watts per nanometer, W/nm), and is often normalized as an arbitrary unit such as power or intensity. The spectra analysis system may further include a reference color pallet 35, which is the reference color pallet of colors to be illuminated by reference light source 32 and multi-color LED light source 31. Reference color pallet may be any user-determined number of colors by which the light spectrum 36, 37 of respective reference light source 32 and multi-color LED light source 31 may be analyzed. In one example, reference color pallet may be a Munsell or Macbeth color chart that may include, for example, about 8 to about 24 colors. In particular, a ColorChecker chart such as MacBeth or Munsell is used to measure and tune/correct the light source 31 e.g., LED lamp settings, such that, for example, the setting of brightness of primary colors comes as close as possible to the desired spectrum (of the Kino Flo lamp). For this, ΔE, a measure for color difference, has to be minimal. In practice: in case ΔE>1 this is certainly visible for the human eye, in case ΔE<1 this is almost invisible for the human eye. Ideally, ΔE=0, which means no color difference. Corresponding with the reference color pallet 35, here in FIGS. 2 and 3 represented as a MacBeth chart, the spectral reflectance data 38 are depicted of the 24 colors in the MacBeth chart, wherein the 24 lines (or line colors) of the graphic correspond to the MacBeth chart colors. An enlarged showing of spectral reflectance data 38 is shown in FIG. 2B. Reflectance spectrophotometers measure color by flashing light onto the surface of a sample and measuring the percentage of spectral reflectance of different wavelengths. The reference color pallet 35, here the MacBeth chart, is illuminated by reference the light source 32 and by the multi-color LED light source 31, respectively, and a reflectance spectrophotometer 41 is used to measure reflected colors of the MacBeth chart, resulting in the respective spectral reflectance distributions 46, 47. An enlarged showing of respective spectral reflectance distribution 47 is shown in FIG. 2D. And An enlarged showing of respective spectral reflectance distribution 46 is shown in FIG. 2E. Such a reflectance spectrophotometer or reflectance spectrometer may be any commercially available spectrometer, for measuring the amount of light reflected by a surface as a function of wavelength to produce a reflectance spectrum. As shown in FIG. 3, spectra analysis system may further include an image capture device such as a camera 33, for example, a video camera, or a movie camera. A video camera may be any commercially available video camera for recording moving images electronically, such as those used in the television industry. A movie camera may be any commercially available movie camera for recording moving images on film, such as those used in the motion picture industry. As further depicted in FIG. 3, the camera 33 has a corresponding sensitivity spectrum 34, representing two possibilities amongst which a standard curve and a Gaussian approximation. An enlarged showing of corresponding sensitivity spectrum 34 is shown in FIG. 3A. Enlarged showing of light spectrum 37 as shown in FIG. 2A corresponds also to light spectrum 37 in FIG. 3. Enlarged showing of light spectrum 36 as shown in FIG. 2C corresponds to light spectrum 36 in FIG. 3. Enlarged showing of spectral reflectance data 38 as shown in FIG. 2B corresponds to the spectral reflectance data 38 in FIG. 3. And enlarged showings of respective spectral reflectance distribution 47, 46 as shown in FIGS. 2D and 2E correspond to spectral reflectance distribution 47, 46 of FIG. 3.

Figures 4A, 4B, 4C:
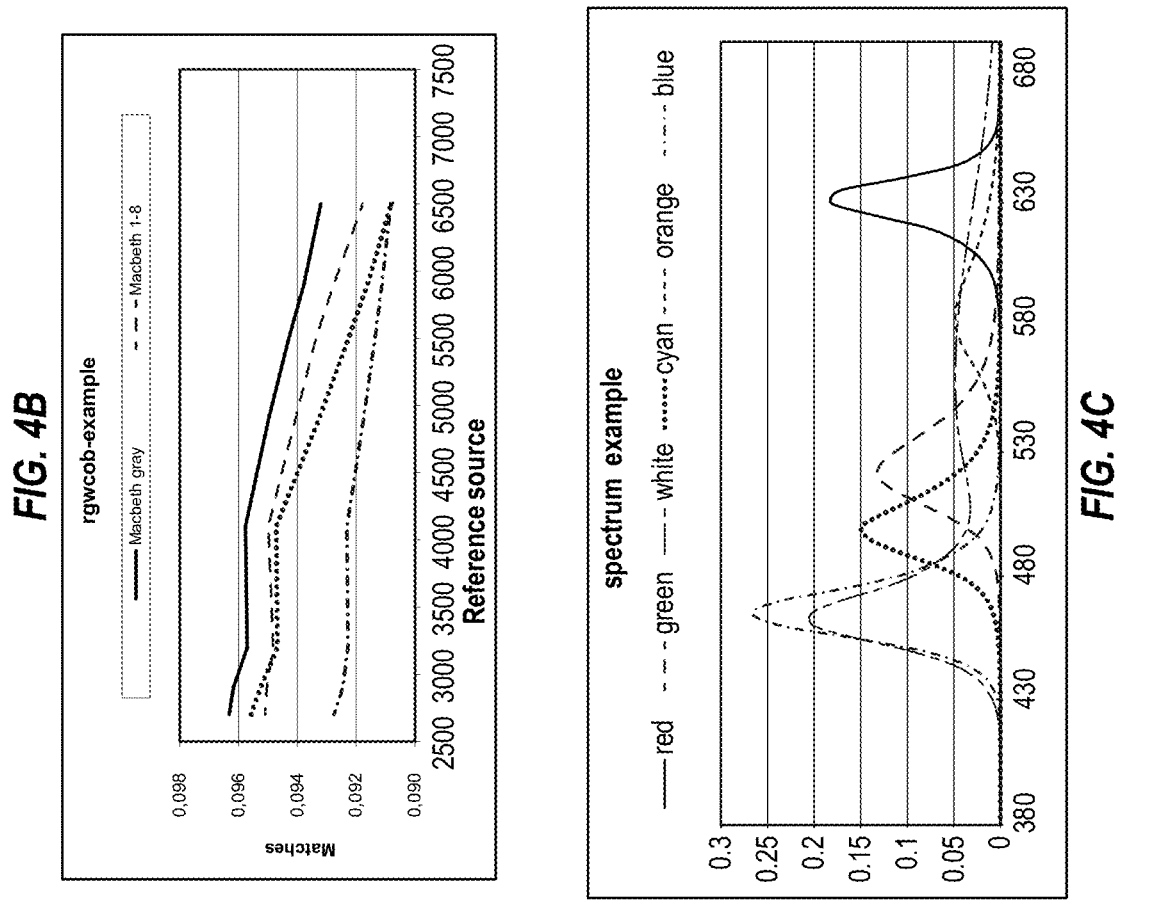
FIG. 4A, FIG. 4B, and FIG. 4C illustrate color matching examples including settings, either represented by numbers or in graphical representation.

FIG. 4 shows the measured outcome of light (originating from a light source display) shining on the ColorChecker chart (both MacBeth and Munsell), wherein the type of light being indicated by means of the color temperature varying from 2700 to 6500K. The light source of the light source display comprises for example Red (R), Green (G), Blue (B), Cyan (C), Orange (O) and White (W) LEDs in one (or multiple) pixels. The spectral measurements are shown in FIG. 4(c). FIG. 4(a) and FIG. 4(b) show the CRI values (in percentage) according to the different charts in function of the color temperature. For example, at 4100 Kelvin, and Macbeth gray chart a match of 95,767=CRI value (or almost 96%) is obtained. The Munsell (color card) settings then are Red 46%, Green 46%, White 46%, Cyan 0%, Orange or Amber 84% and Blue 0%, as indicated in FIG. 4(a). By consequence it can be stated that for a traditional CRI optimization for traditional screens using traditional RGB LEDs, the best first color to add is Orange or Amber and then subsequently White (RGB is there anyway). It is noted that the drawback of adding LED White (made of Blue LED and yellow phosphor) is that it uses Blue phosphor excitation, which means that even for low use of 'Blue' there will always be a 'peak' in Blue that needs to excite the yellow phosphor. Hence, white LEDs easily have a bluish appearance or impression.

While referring to FIG. 3, in case a camera is 'looking' at or imaging the apples (or objects in general) of FIG. 6, the camera sensitivity needs to be taken into account, so that the image that is outputted by the camera has a high CRI impression.

It is noted that a contradiction should be solved here, the contradiction having been found and addressed by the inventors of the present application. When looking at a display as a user, the colors are preferably as "deep" as possible. For example, in the ITU-R BT2020 definition for R, G and B or even NTSC color triangle. The more "narrow"-band emitters the LEDs are, the closer their light output will lie on the borders of the CIE 1932 Chromaticity diagram (Lambda—CIE curve). This can be seen in FIG. 5. FIG. 5(a) is with narrow band Green, whereas FIG. 5(b) is with wide band Green. The wide band Green 'color' triangle in FIG. 5(c) is much smaller than the one in FIG. 5(d). Hence, the contradiction. For display purposes, we want narrow band emitters and large color triangle corresponding to FIGS. 5(a) and 5(d) respectively, and for lighting/CRI purposes we need wider band LEDs (or phosphor excited color LEDs) and small color triangle corresponding to FIG. 5(b) and FIG. 5(c), respectively.

The inventors of the present application have found that a solution for this contradiction can be by adding an extra color (proposed is Amber) to for instance RGB. This is further described with FIG. 7, which illustrates different pixel configurations to be used in display tiles and system, including novel pixel configurations 72, 73, 74, 75, 76, 77, 78 in accordance with the invention. Herein, pixel configuration 70 is a traditional RGB 2×2 LED configuration having the RGB LED dies arranged next to each other, whereas pixel configuration 71 comprises 2×2 RGB LEDs wherein per LED (4 in total) the RGB LED dies being stacked on top of each other. It is noted that the RGB LED dies each may have a die size and a die color as shown in FIG. 8, as earlier discussed by the same Applicant is U.S. patent application Ser. No. 18/216,459, filed at the USPTO on Jun. 29, 2023 (also referred to by Applicant as "Cluster B—Multiplexed Array" application), which is herein incorporated by reference.

FIG. 8 illustrates an RGB LED in front view, as part of a LED display, wherein the LED comprises a Red, Green and Blue LED die (layer) positioned on top of each other. The LED 80 itself is shown on the display 8 as well as zoomed out in enlarged version. An xyz-coordinate system is given to facilitate the description. The LED dies 81, 82, 83 can be considered as separate or individual parts. The LED dies 81, 82, 83 can, for example, be seen, considered or interpreted as separate (surface) layers, of which their surfaces being positioned parallel to each other, in or parallel with (or along) xy-plane and perpendicular to z-axis. The dies or die layers 81, 82, 83 can be bonded by means of bonding techniques. As an alternative, the dies or die layers are positioned at a distance from each other, while having molding or something else (e.g., air) in between. All die layers can be separated at the same distance, although it is not excluded that a difference in distance (separating the layers from each other) occurs. The LED dies may be surrounded by molding, including in between the LED dies, molding can be provided. The top of the stack is at the front of the LED display, where the eye (or a person) is looking at (images being displayed thereon). Considering again FIG. 8, this means that in this case, the Red LED die 81 is on top of the stack, whereas the Blue LED die 83 is at the bottom (towards the back of the display) and the Green LED die 82 being positioned in the middle, in between the Red and Blue LED die layers. If the LED dies are thin enough, they can be transparent (or have a high level of transparency) and the most transparent LED die (with highest level of transparency) is then preferably placed on top. The degree or level of transparency will depend on the manufacturing process of the individual color LED dies.

A LED display or tile may comprise of multiple LED modules. The LED display (and/or module) may comprise multiple LEDs arranged on a horizontal and vertical grid. Hence, an array or matrix of LEDs is formed and determines the architecture of the LED display (and/or module). Each LED has an anode and a cathode (not shown here). In general, such LED display comprises an electronical interface, and electronics to light up the individual LEDs, and is controlled by signals on the electronical interface. The electronical interface can be defined by a LED drive circuit having electrical connections, defined by rows and columns that electrically connect to the LEDs in the LED array or matrix. The LED display (and/or module) may comprise molding in between the LEDs.

Returning back to FIG. 7, pixel configuration 72 is an example layout wherein for 2 of the 4 LEDs Red is replaced by Amber (Range 570-610 nm peak wavelength), in accordance with the invention. As an alternative, the replacement of Red by Amber can also be done in case of stacked LED dies, as shown with pixel configuration 73 in accordance with the invention. It is noted that for achieving the desired color to display, calibration principles can be used as, for example described by the same Applicant in U.S. patent application Ser. No. 16/813,113, and U.S. patent application Ser. No. 18/100,198, both having priority date of Mar. 7, 2019 (also referred to as the "Stretch" and "Stretch calibration" application respectively), which are each respectively incorporated by reference, wherein negative coefficients (and clipping) are referred to as they may become important.

As stated in U.S. patent application Ser. No. 16/813,113, and U.S. patent application Ser. No. 18/100,198, when taking negative coefficients always into account, they remain "present" and still can have effect when mixing other input colors, herewith preserving the desired color when mixed. When allowing negative coefficients, deeper or more saturated colors can be viewed, or virtually deeper colors are taken into account for the calibration calculations. By means of example, if the LED or pixel with Amber needs to display a color close to Red, the calibration system will try to get as close as possible and then 'clip' (i.e. putting an artificial limitation, hence meaning going to '0' or maximum) to the nearest color possible. Further, the content dependent calibration as explained in the same "Stretch" application can be used to create the correct color perception.

As also stated in U.S. patent application Ser. No. 17/865,096 (which is referred to herein as the "Studio2" application), filed at the USPTO on Jul. 14, 2022, timing dependent calibration can be enabled wherein colors (calibration) are adjusted during e.g. camera shutter opening time. Adding the extra 'color' will increase the color rendering for the human eye and can also be used to achieve better 'indirect lighting' color response of objects in front of a screen. The principles for calculating the best method to be used during these timings will depend on the spectrum emitted by the LEDs, the camera color response, and the desired camera output.

Figure 7:
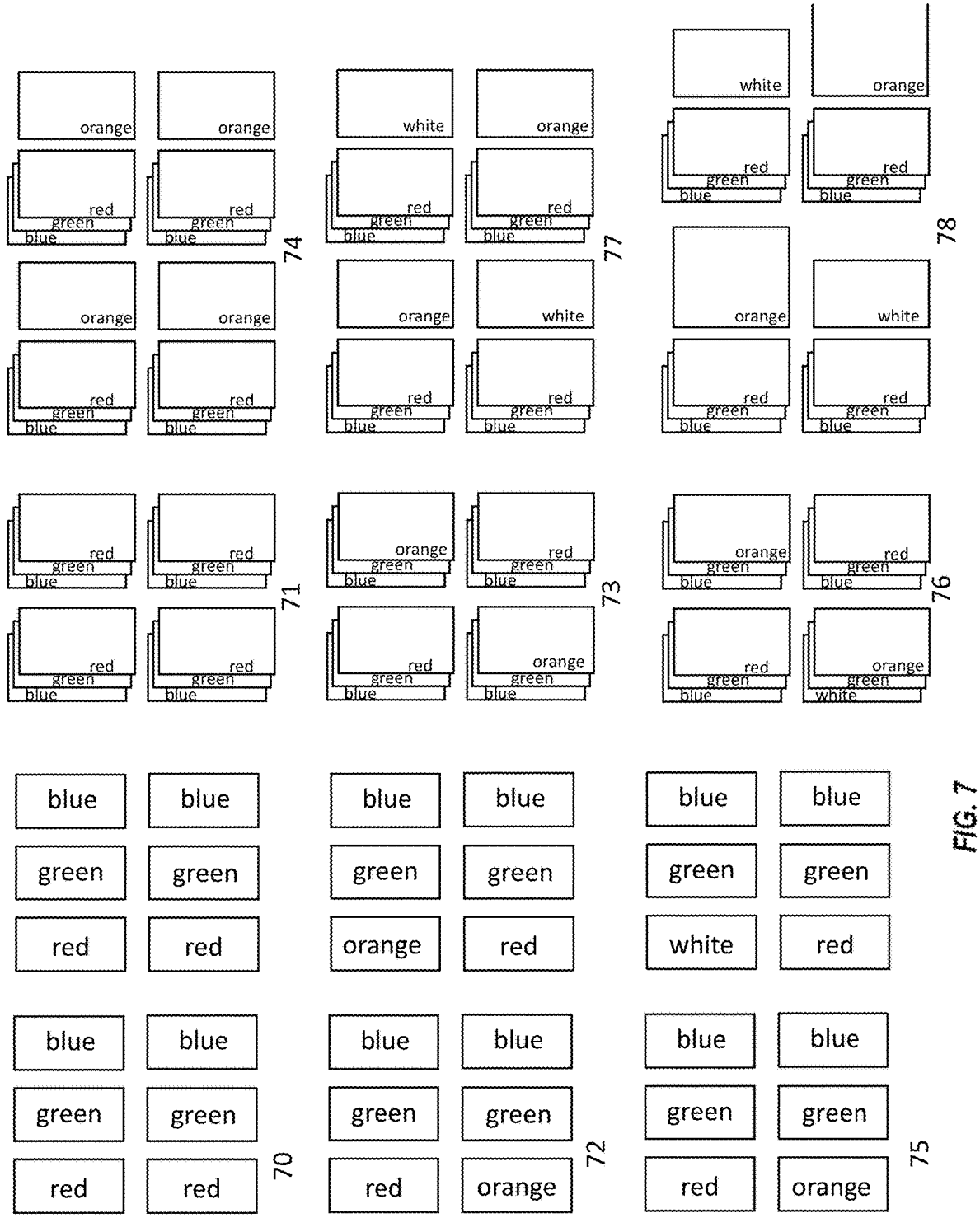
FIG. 7 illustrates multiple color pixel configurations, in accordance with the invention.
Figure 8:
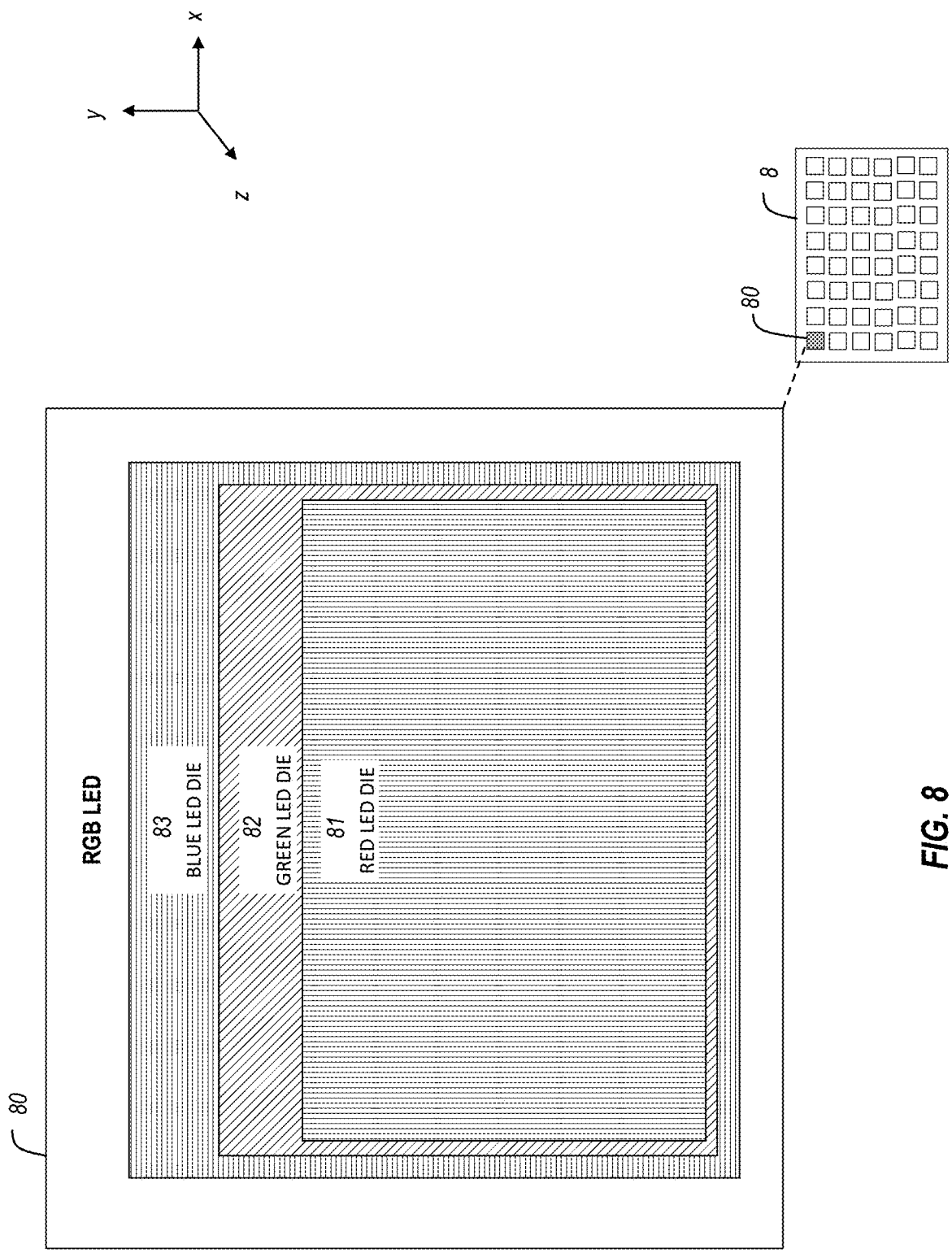
FIG. 8 illustrates an RGB LED in front view, as part of a LED display, wherein the LED comprises a Red, Green and Blue LED die (layer) positioned on top of each other.

Further in FIG. 7, pixel configurations 75, 76 are examples of other proposals of pixel layouts, in accordance with the invention, wherein in one of the 4 LEDs Red is replaced by Amber, and for another one of the 4 LEDs Red is replaced by White. Here again, the replacement can also be done in case of stacked LED dies, as shown with pixel configuration 76. It is noted that in case of the stacked pixel configurations 73, 76, Blue is chosen to be at the bottom with optionally a phosphor layer (not shown) in-between as otherwise the other colors would be filtered out. As regard to the pixel configurations 74, 77, in accordance with the invention, an "additional" color is just added here by adding for each existing LED (4 in total) an extra LED or LED die, here Amber in case of pixel configuration 74, or Amber or White in case of pixel configuration 77.

The concepts of the present invention may also be applied to what is described in U.S. patent application Ser. No. 18/216,459, filed at the USPTO on Jun. 29, 2023 (also referred to by Applicant as "Cluster B—Multiplexed Array" application) from the same Applicant. Further, while referring to U.S. patent application Ser. No. 18/322,279, filed at the USPTO on May 23, 2023 (also referred to by Applicant as "Cluster A—Active Receiver Card" application) if a system has 2 inputs (see description regarding redundancy and active receiver card in this Cluster A application), the "data" for the additional (non-RGB colors) can be derived from the 2nd stream. According to an embodiment if this is not the case, the mathematics for getting "as close match as possible" of minimal desired ΔE (i.e., a measure for color difference) are to be included in the active receiver card.

As shown in FIG. 8, the Red, Green and Blue LED dies 81, 82, 83 each have a different individual die size. The LED die size determines the amount of light emitted by that particular LED die. Assume it is wanted to show D65 white light and assuming the LED die size determines the maximum white light. Given the same drive level, then the size can be increased. For example, for D65 white light we need 100% of red light, 80% of green light and 80% of blue light drive, we can increase the Red die size so that it also needs 80%. Making the Red die larger, it will be able to emit more light, and hence 100% light output for the smaller Red die size will for example correspond to 80% light output for the larger Red die size. As a result, 80% of red light, 80% of green light and 80% of blue light drive can be obtained. All colors can then be brought to 100% light output again and hence all individual colors can be increased to 100%.

Returning back again to FIG. 7, in particular pixel configuration 78 wherein the additional Amber LED die has an increased die size as compared to pixel configuration 77, in accordance with an embodiment of the invention. The die sizes can be increased or decreased according to the optimal size needed dependent on its efficiency, desired drive current etc. as discussed with FIG. 8 above.

It is noted that the "multiplexing" or layout scheme, as described in U.S. patent application Ser. No. 18/216,459, filed at the USPTO on Jun. 29, 2023 (also referred to by Applicant as "Cluster B—Multiplexed Array" application) from the same Applicant, in particular referring e.g., to FIG. 12 therein and the description thereof, can be used to drive the individual colors.

Further is noted that e.g. for a Green LED, when changing the drive current, the color also changes slightly. More specifically, for example, when driving such Green LED at 40 mA instead of 20 mA, this can shift the Green color from 510 to 530 nm wavelength. Hence, the impression of a 'broader' spectrum (in wavelength) of the LEDs can be created.

Usually, LEDs are specified at a certain constant current drive level—usually 10 mA or 20 mA. When driving LEDs in a full color video application, these specifications do not satisfy the full qualification for usage. It has been shown that efficiencies of LEDs at other drive current circumstances can differ a lot, both in light output and in color coordinate variation. The explanation becomes clear when considering the following measurement graphics.

Figure 9:
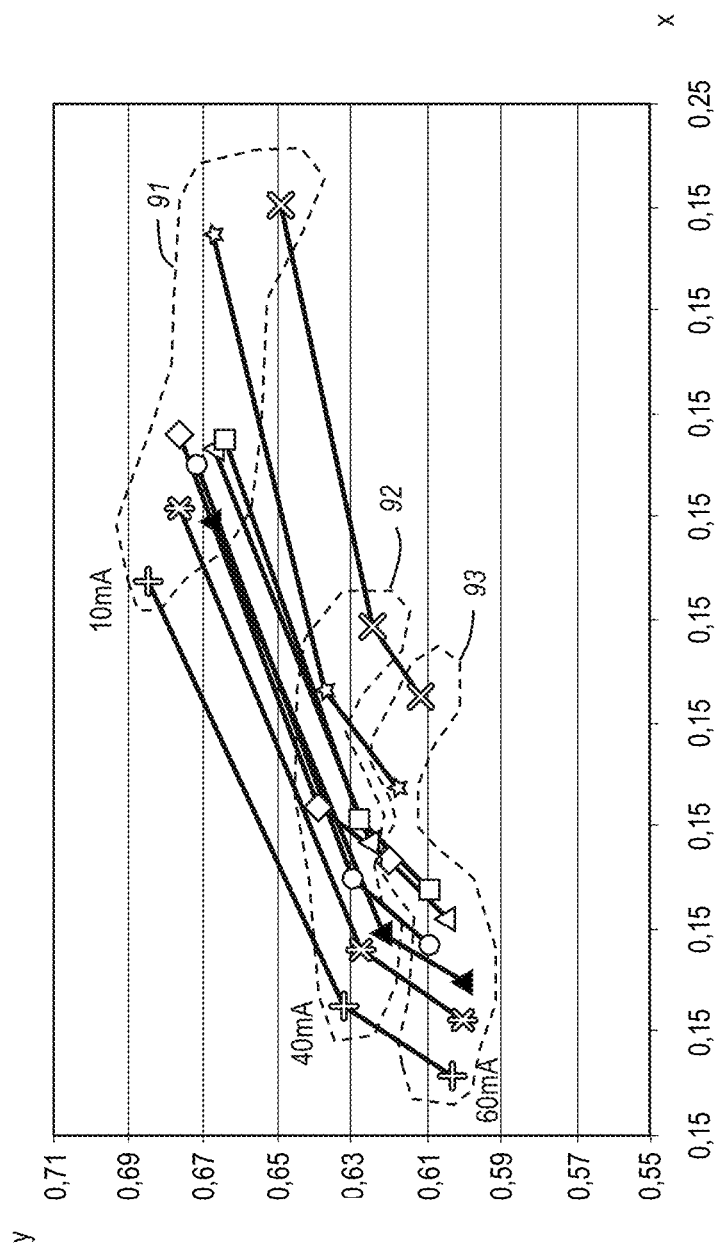
FIG. 9 illustrates a graphic wherein x and y coordinates are represented by x-axis and y-axis respectively, for different types of Green LED measured at different drive currents respectively.
Figure 10:
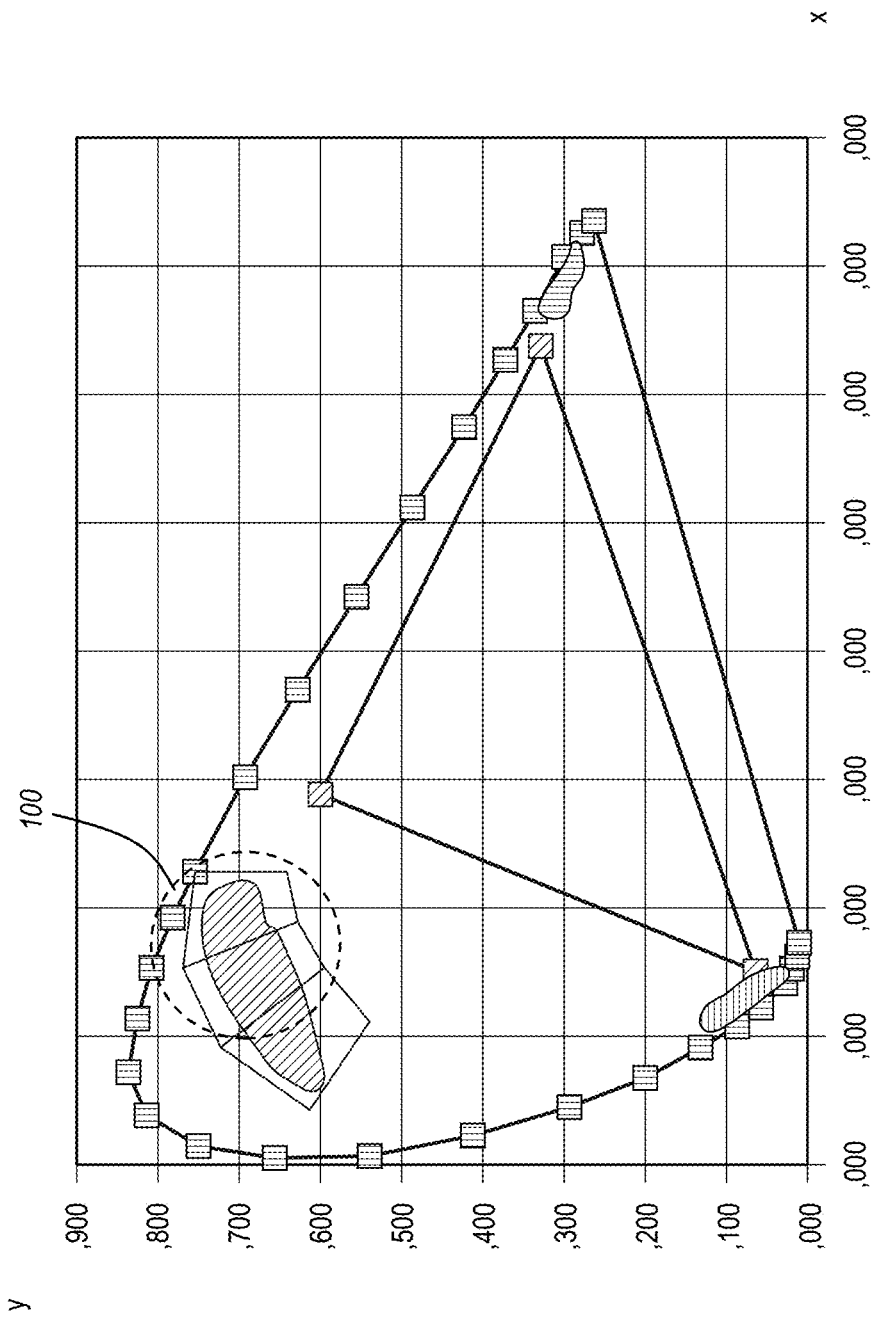
FIG. 10 illustrates CIE chromaticity diagram wherein the x and y coordinates corresponding with the different types of Green LED (from FIG. 9) are represented.

In FIG. 9, x and y coordinates are represented by x-axis and y-axis respectively, for 9 different types of Green LED measured at 3 different drive currents i.e. 10 mA, 40 mA and 60 mA respectively. As a result, an efficiency curve tracking with 3 measurement points at these drive currents respectively, is illustrated for the 9 different types of Green LED. Overall, the curves are similar to each other, however not exactly the same. There is a slight difference in efficiency amongst them, as represented by the more or less steep slopes of the respective curves. Moreover, at a certain specified drive current level, i.e. 10 mA, 40 mA and 60 mA respectively, different x and y coordinates are measured for each of the 9 types, and hence a color distribution exists. In addition, for each specified drive current level 10 mA, 40 mA and 60 mA respectively, the color distribution pattern 91, 92, 93 is different in size and location, i.e. different area and size of region for x and y coordinates. At lower x and y levels, certain crossover points can also be detected (i.e. for example for a certain y-value (e.g., 0.62) there is an x-value (e.g., 0.17) in the 60 mA region, and an x-value (0.177) in the 40 mA region respectively). In the CIE chromaticity diagram (generally given at 20 mA) of FIG. 10, the x and y coordinates corresponding with the 9 different types of Green LED are encircled with the dashed circle 100. The curves for the 9 different types of Green LED all show the effect of change in drive current on the color coordinates. It can be concluded that as a general parameter, both x and y coordinates for each of the Green LED types decrease while the drive current is increasing.

Figure 11:
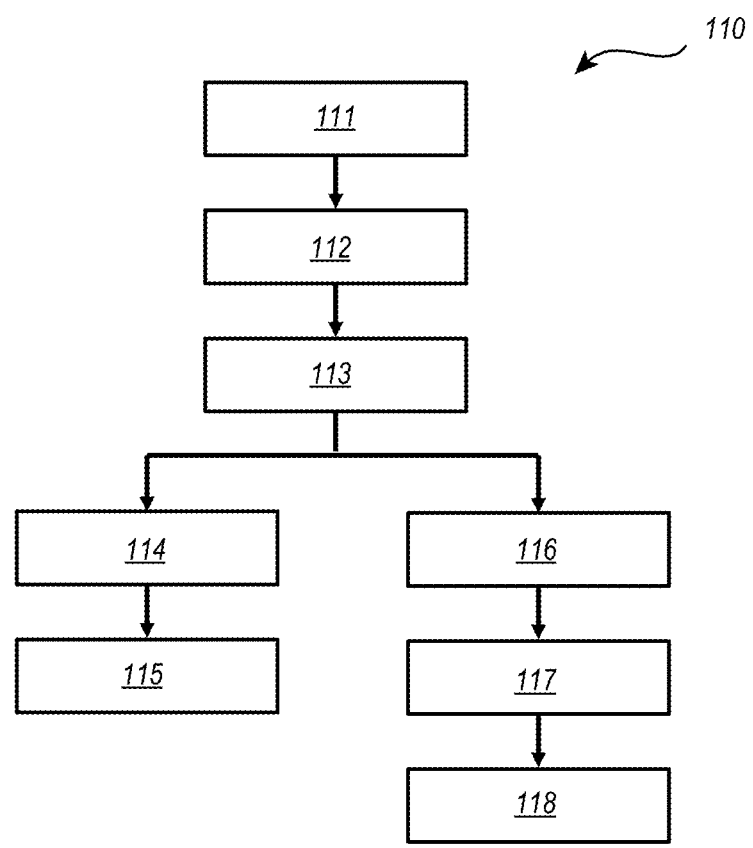
FIG. 11 illustrates a flowchart embodiment describing a method for replacing colors into a pixel configuration of a light-emitting display system and/or adding extra colors therein, of which the result is for example illustrated in FIG. 7.

FIG. 11 illustrates a flowchart embodiment describing a method for replacing colors into a pixel configuration of a light-emitting display system and/or adding extra colors therein, of which the result is for example illustrated in FIG. 7. The method 110 is following different steps that are herewith discussed. In a first step 111, a display system is provided comprising a display. Next, in step 112, a processor is provided in the display system, such that the display system can be considered an active display system. A processor, or what may be "digital logic" or "a process unit" is used to refer generally to what is understood to be hardware digital logic, digital logic circuitry, control circuitry, or other circuitry or controlling circuitry, a microprocessor, or one or more processors, controllers or computing devices, based on software or circuitry, that operate based on received or stored instructions, such hardware being formed of one or more integrated circuits or otherwise, which may be implemented on a single metal-oxide-semiconductor integrated circuit chip or otherwise, which may include electronic components, for example, transistors, diodes, resistors, gates, relays, switches, amplifiers, inverters, buffers, and/or capacitors, etc., that are used to receive, process, perform logical operations on, mathematical operations, algorithmic operations, calculations, and/or store signals, data, and/or information, including digital and/or analog signals, or continuous or non-continuous signals, and output one or more signals based thereon. Referring further to the method 110 of FIG. 11, the processor in particular is configured for performing one or more mathematical operations, and may comprise digital logic and/or digital circuits. Step 113 regards the provision of light-emitting elements (LEEs) in the display of the display system. The LEEs are considered to comprise at least three basic primary colors, such as for example Red (R), Green (G) and Blue (B). Then, there are two possible ways in further proceeding with the method. One way is to continue with step 114 wherein, amongst the at least three basic primary colors, e.g., RGB, one of the basic primary colors is replaced by an additional primary color, such as for example Amber or White. It is important to note that this replacing being for part of the display or display system, and not for the entire display or display system. In step 115 at least one mathematical operation is performed for adjusting color balance of the LEEs. This one (or more) mathematical operation(s) is performed by the display system, or in particular by the processor thereof. Considering now the other way to proceed with the method, the next step to be taken is step 116, wherein at least one additional primary color, e.g., Amber or White, is added to and in between the at least three basic primary colors, e.g., RGB. In step 117, the option is considered of possibly increasing the die size of one of the at least one additional primary color. As for example illustrated in FIG. 7, with pixel configuration 78, the Amber die size could be increased to herewith improve efficiency of the die. In step 118, again at least one mathematical operation is performed for adjusting color balance of the LEEs. This one (or more) mathematical operation(s) is again performed by the display system, or in particular by the processor thereof. According to an embodiment, the two possible ways of the method, i.e. on the hand replacing colors, and on the other hand adding colors (including adapting die size, by increasing or decreasing it along particular requirements), are both executable simultaneously.

Figure 12:
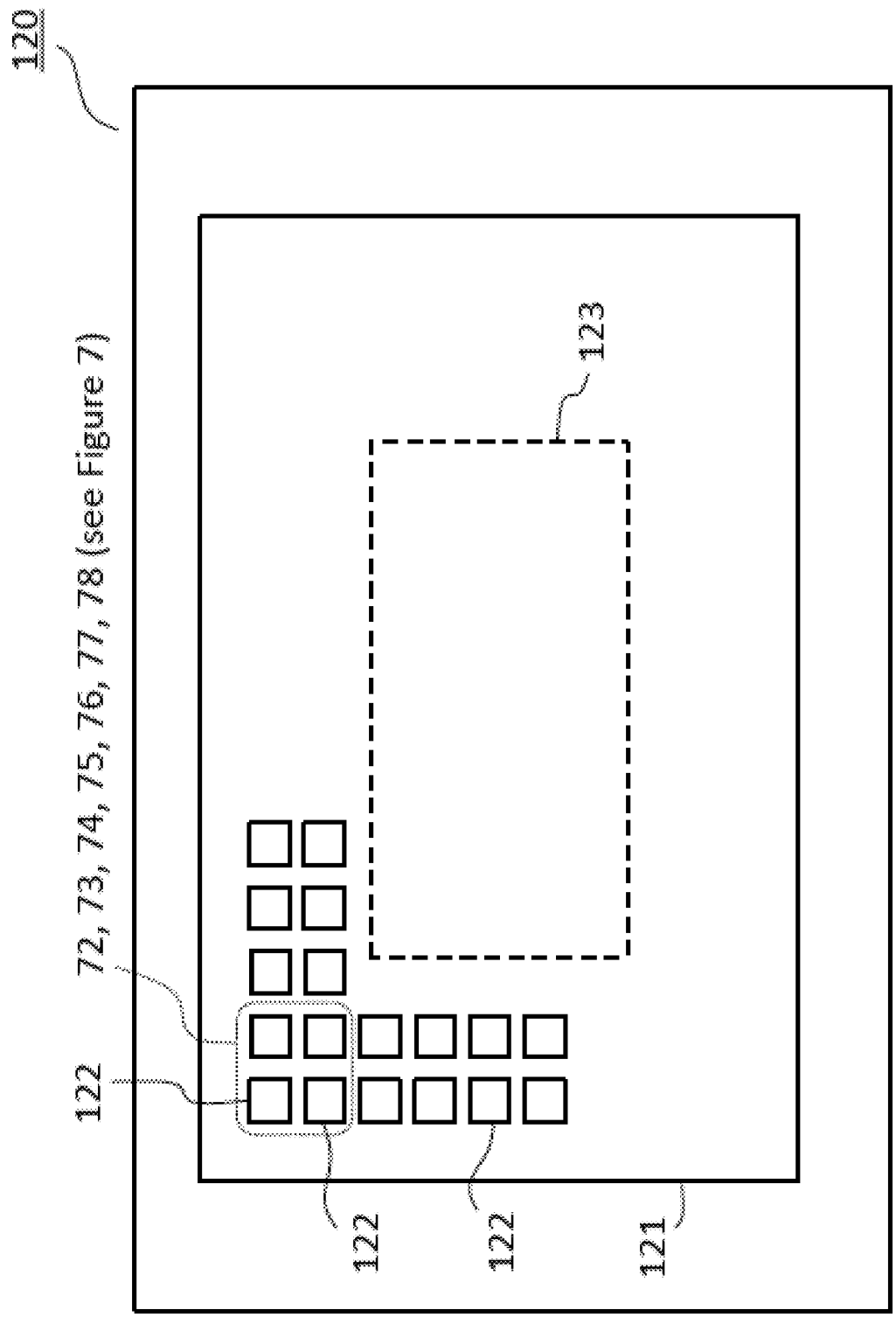
FIG. 12 illustrates an embodiment of a light-emitting display system, comprising a display, a processor and multiple color pixel configurations as for example illustrated in FIG. 7, in accordance with the invention.

FIG. 12 illustrates an embodiment of a light-emitting display system 120, comprising a display 121 and a processor 123. The display 121 comprises a plurality of light-emitting elements (LEEs) 122, such as for example LEDs. Although the entire surface of the display 121 is not depicted with LEEs 122, it is understood that LEEs can be present on the whole surface of the display 121. Amongst the LEEs, a combination of four LEEs is circled and indicated with the possible multiple color pixel configurations 72, 73, 74, 75, 76, 77, 78 as for example illustrated in FIG. 7, in accordance with the invention. In other words, the LEEs 122 comprise at least three basic primary colors, and at least one additional primary color, wherein, for at least part of the display system, one of the at least three basic primary colors is replaced by the at least one additional primary color, or else, the at least one additional primary color is added to and/or in between the at least three basic primary colors. Herewith, the processor 123 is configured to perform at least one mathematical operation for adjusting color balance of the LEEs 122. Although only shown, and particularly indicated for the circled four LEEs in FIG. 12, the same principle of multiple color pixel configurations, in accordance with the invention, can be also applicable for other LEEs of the display.

In the above description, various embodiments are described based on or including Light Emitting Diodes (LEDs) or LED displays. However, the concepts described here are equally applicable to other forms of light-emitting elements (LEEs) or other light-emitting devices, where applicable or possible, including, but not limited to, Liquid Crystal Displays (LCDs) implement an array of pixels like that of an LED display, Active Matrix Organic Light Emitting Diode (AMOLED) displays, Organic Light Emitting Diode (OLED) displays, Full-array LED displays, Mini-LED displays, Micro-LED displays, Quantum LED (QLED) displays, Quantum Dot-OLED (QD-OLED) displays, etc.

Combinability of Embodiments and Features

This disclosure provides various examples, embodiments, and features which improve a visual performance of a display and/or a camera recording an image from the display. Unless expressly stated, or unless such examples, embodiments, and features would be mutually exclusive, the various examples, embodiments, and features disclosed herein should be understood to be combinable with other examples, embodiments, or features described herein.

In addition to the above, further embodiments and examples include the following:

A first group of embodiments of light-emitting display systems are enumerated and described below.

1. A light-emitting display system comprising: a processor; and a display having a plurality of light-emitting elements (LEEs), wherein said LEEs comprise at least three basic primary colors, and at least one additional primary color, wherein one of said at least three basic primary colors is for part of said display system replaced by said at least one additional primary color, or said at least one additional primary color is added to and in between said at least three basic primary colors, and wherein said display system is configured to perform at least one mathematical operation for adjusting color balance of said LEEs.

2. The light-emitting display system according to any one or a combination of one or more of 1 above and 3-12 below, wherein said processor is configured to perform at least one mathematical operation for adjusting color balance of said LEEs.

3. The light-emitting display system according to any one or a combination of one or more of 1-2 above and 4-12 below, further comprises digital logic and/or digital circuits, possibly as being part of said processor.

4. The light-emitting display system according to any one or a combination of one or more of 1-3 above and 5-12 below, wherein the at least three basic primary colors are Red, Green and Blue.

5. The light-emitting display system according to any one or a combination of one or more of 1-4 above and 6-12 below, wherein the at least one additional primary color is Amber.

6. The light-emitting display system according to any one or a combination of one or more of 1-5 above and 7-12 below, wherein the at least one additional primary color is White.

7. The light-emitting display system according to any one or a combination of one or more of 1-6 above and 8-12 below, wherein Amber and White are added as additional primary color.

8. The light-emitting display system according to any one or a combination of one or more of 1-7 above and 9-12 below, wherein said processor is embedded within an active receiver card, further comprising a first interface and a second interface.

9. The light-emitting display system according to one of 6 above, wherein said first interface may be configured to receive a serialized video data stream as input from a video processing system, and said processor may be configured to extract a corresponding pixel value from the serialized video data stream, and to perform said at least one mathematical operation on the corresponding pixel value.

10. The light-emitting display system according to any one or a combination of one or more of 1-9 above and 11-12 below, wherein gamma processing is provided.

11. The light-emitting display system according to any one or a combination of one or more of 1-10 above and 12 below, wherein time dependent calibration is provided.

12. The light-emitting display system according to any one or a combination of one or more of 1-11 above, wherein content dependent calibration is provided.

13. A display method is also provided comprising: providing a light-emitting display system according to any one or a combination of two or more any of 1-12 above; and performing by said processor said at least one mathematical operation for adjusting the color balance of said LEEs.

14. A hardware storage device having stored thereon computer-executable instructions which, when executed by one or more processors of any one or a combination of two or more any of 1-12 above, cause the processor to perform said at least one mathematical operation for adjusting the color balance of said LEEs.

A second group of embodiments of light-emitting display systems are enumerated and described below.

1. A light-emitting display system comprising: a processor; and a display having a plurality of light-emitting elements (LEEs), wherein said LEEs comprise at least three basic primary colors and said display has a first color output at a first drive current, wherein said display system is configured to change said first drive current to a second drive current in a vertical sync frame, defined as a frame wherein a new image is shown on the display after receiving a vertical sync signal, such that the first color output can be changed to a second color output, and wherein said display system is configured to perform at least one mathematical operation for calculating the second color output dependent on said second drive current, and to perform at least one mathematical operation for adjusting color balance of said LEEs.

2. The light-emitting display system according to any one or a combination of one or more of 1 above and 3-12 below, wherein said processor is configured to perform at least one mathematical operation for adjusting color balance of said LEEs.

3. The light-emitting display system according to any one or a combination of one or more of 1-2 above and 4-12 below, further comprises digital logic and/or digital circuits, possibly as being part of said processor.

4. The light-emitting display system according to any one or a combination of one or more of 1-3 above and 5-12 below, wherein the at least three basic primary colors are Red, Green and Blue.

5. The light-emitting display system according to any one or a combination of one or more of 1-4 above and 6-12 below, further comprising at least one additional primary color, such for example Amber or White.

6. The light-emitting display system according to any one or a combination of one or more of 1-5 above and 7-12 below, wherein at least once said first drive current is changed to said second drive current, in order to change the first color output of the display to the second color output.

7. The light-emitting display system according to one of 6 above, wherein said change of said first drive current and said first color output is performed for improving the interplay of the display with a camera recording images being displayed by the display, said camera having a shutter and corresponding shutter opening time, said change occurring either in or out of the camera shutter opening time.

8. A display method comprising: providing a light-emitting display system any one or a combination of two or more any of 1-7 above; changing said first drive current to a second drive current in a vertical sync frame, defined as a frame wherein a new image is shown on the display after receiving a vertical sync signal, such that the first color output can be changed to a second color output; performing by said processor said at least one mathematical operation for calculating the second color output dependent on said second drive current; and performing by said processor said at least one mathematical operation for adjusting color balance of said LEEs.

9. A hardware storage device having stored thereon computer-executable instructions which, when executed by one or more processors of a display system according to any one or a combination of two or more any of 1-7 above, cause the processor to: change said first drive current to a second drive current in a vertical sync frame, defined as a frame wherein a new image is shown on the display after receiving a vertical sync signal, such that the first color output can be changed to a second color output; perform by said processor said at least one mathematical operation for calculating the second color output dependent on said second drive current; and perform by said processor said at least one mathematical operation for adjusting color balance of said LEEs Although various example embodiments have been described in detail herein, those skilled in the art will readily appreciate in view of the present disclosure that many modifications are possible in the example embodiments without materially departing from the concepts of present disclosure. Accordingly, any such modifications are intended to be included in the scope of this disclosure. Likewise, while the disclosure herein contains many specifics, these specifics should not be construed as limiting the scope of the disclosure or of any of the appended claims, but merely as providing information pertinent to one or more specific embodiments that may fall within the scope of the disclosure and the appended claims. Any described features from the various embodiments disclosed may be employed in combination. In addition, other embodiments of the present disclosure may also be devised which lie within the scopes of the disclosure and the appended claims. Each addition, deletion, and modification to the embodiments that falls within the meaning and scope of the claims is to be embraced by the claims.

Certain embodiments and features may have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges may appear in one or more claims below. Any numerical value is "about" or "approximately" the indicated value, and takes into account experimental error and variations that would be expected by a person having ordinary skill in the art.

The invention claimed is:

1. A light-emitting display system comprising:
a processor; and
a display having a plurality of light-emitting elements (LEEs),
wherein said LEEs comprise at least three basic primary colors, and at least one additional primary color,
wherein, for at least part of said display system, one of said at least three basic primary colors is replaced by said at least one additional primary color, or said at least one additional primary color is added to and/or in between said at least three basic primary colors,
wherein said processor is configured to perform at least one mathematical operation for adjusting color balance of said LEEs, and
wherein said processor is embedded within an active receiver card, and said active receiver card further comprises a first interface and a second interface.

2. The light-emitting display system of claim 1, further comprising digital logic and/or digital circuits, or further comprising digital logic and/or digital circuits as being part of said processor.

3. The light-emitting display system of claim 1, wherein the at least three basic primary colors are Red, Green and Blue.

4. The light-emitting display system of claim 1, wherein the at least one additional primary color is Amber and/or White.

5. The light-emitting display system of claim 1, wherein the at least one additional primary color include Amber and White.

6. The light-emitting display system of claim 1, wherein said first interface is configured to receive a serialized video data stream as input from a video processing system, and said processor is configured to extract a corresponding pixel value from the serialized video data stream, and perform said at least one mathematical operation on the corresponding pixel value.

7. The light-emitting display system of claim 1, wherein gamma processing is provided, and/or wherein said processor provides gamma processing.

8. The light-emitting display system of claim 1, wherein time dependent calibration is provided, and/or wherein said processor provides time dependent calibration.

9. The light-emitting display system of claim 1, wherein content dependent calibration is provided, and/or wherein said processor provides content dependent calibration.

10. A display method comprising:
providing a light-emitting display system according to claim 1; and
performing by said processor said at least one mathematical operation for adjusting the color balance of said LEEs.

11. A hardware storage device having stored thereon computer-executable instructions which, when executed by one or more processors of a display system according to claim 1, cause the processor to perform said at least one mathematical operation for adjusting the color balance of said LEEs.

12. A light-emitting display system comprising:
a processor; and
a display having a plurality of light-emitting elements (LEEs),
wherein said LEEs comprise at least three basic primary colors and said display has a first color output at a first drive current,
wherein said display system is configured to change said first drive current to a second drive current in a vertical sync frame, defined as a frame wherein a new image is shown on the display after receiving a vertical sync signal, such that the first color output can be changed to a second color output,
wherein said processor is configured to perform at least one mathematical operation for calculating the second color output dependent on said second drive current, and to perform at least one mathematical operation for adjusting color balance of said LEEs, and
wherein at least once said first drive current is changed to said second drive current, in order to change the first color output of the display to the second color output.

13. The light-emitting display system of claim 12, further comprises digital logic and/or digital circuits, possibly as being part of said processor.

14. The light-emitting display system of claim 12, wherein the at least three basic primary colors are Red, Green and Blue.

15. The light-emitting display system of claim 12, further comprising at least one additional primary color, such for example Amber or White.

16. The light-emitting display system of claim 12, wherein said change of said first drive current and said first color output is performed for improving the interplay of the display with a camera recording images being displayed by the display, said camera having a shutter and corresponding shutter opening time, said change occurring either in or out of the camera shutter opening time.

17. A display method comprising:
providing a light-emitting display system that includes
a processor, and
a display having a plurality of light-emitting elements (LEEs),
wherein said LEEs comprise at least three basic primary colors and said display has a first color output at a first drive current,
wherein said display system is configured to change said first drive current to a second drive current in a vertical sync frame, defined as a frame wherein a new image is shown on the display after receiving a vertical sync signal, such that the first color output can be changed to a second color output, and
wherein said processor is configured to perform at least one mathematical operation for calculating the second color output dependent on said second drive current, and to perform at least one mathematical operation for adjusting color balance of said LEEs;

changing said first drive current to a second drive current in a vertical sync frame, defined as a frame wherein a new image is shown on the display after receiving a vertical sync signal, such that the first color output can be changed to a second color output;

performing by said processor said at least one mathematical operation for calculating the second color output dependent on said second drive current; and performing by said processor said at least one mathematical operation for adjusting color balance of said LEEs.

18. A hardware storage device having stored thereon computer-executable instructions which, when executed by one or more processors of a display system that includes a processor, and a display having a plurality of light-emitting elements (LEEs), wherein said LEEs comprise at least three basic primary colors and said display has a first color output at a first drive current, wherein said display system is configured to change said first drive current to a second drive current in a vertical sync frame, defined as a frame wherein a new image is shown on the display after receiving a vertical sync signal, such that the first color output can be changed to a second color output, and wherein said processor is configured to perform at least one mathematical operation for calculating the second color output dependent on said second drive current, and to perform at least one mathematical operation for adjusting color balance of said LEEs, the instructions cause the processor to change said first drive current to a second drive current in a vertical sync frame, defined as a frame wherein a new image is shown on the display after receiving a vertical sync signal, such that the first color output can be changed to a second color output;

perform by said processor said at least one mathematical operation for calculating the second color output dependent on said second drive current; and perform by said processor said at least one mathematical operation for adjusting color balance of said LEEs.

* * * * *